US010366002B2

United States Patent
Atkisson et al.

(10) Patent No.: US 10,366,002 B2
(45) Date of Patent: Jul. 30, 2019

(54) APPARATUS, SYSTEM, AND METHOD FOR DESTAGING CACHED DATA

(71) Applicant: SanDisk Technologies LLC, Plano, TX (US)

(72) Inventors: David Atkisson, Draper, UT (US); David Flynn, Sandy, UT (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 550 days.

(21) Appl. No.: 14/822,351

(22) Filed: Aug. 10, 2015

(65) Prior Publication Data

US 2016/0041902 A1 Feb. 11, 2016

Related U.S. Application Data

(63) Continuation of application No. 13/088,211, filed on Apr. 15, 2011, now Pat. No. 9,104,599, which is a
(Continued)

(51) Int. Cl.
| | |
|---|---|
| G06F 12/02 | (2006.01) |
| G06F 12/0875 | (2016.01) |
| H04L 12/403 | (2006.01) |
| G06F 11/10 | (2006.01) |
| G06F 12/0804 | (2016.01) |
| H05K 7/14 | (2006.01) |
| H04L 12/46 | (2006.01) |
| G06F 12/0866 | (2016.01) |

(Continued)

(52) U.S. Cl.
CPC ........ *G06F 12/0246* (2013.01); *G06F 11/108* (2013.01); *G06F 12/0804* (2013.01); *G06F 12/0866* (2013.01); *G06F 12/0875* (2013.01); *G06F 13/28* (2013.01); *G06F 13/4022* (2013.01); *H04L 12/403* (2013.01); *H04L 12/4625* (2013.01); *H05K 7/1444* (2013.01); *G06F 3/0656* (2013.01); *G06F 3/0688* (2013.01); *G06F 2211/103* (2013.01); *G06F 2212/1024* (2013.01); *G06F 2212/2022* (2013.01); *G06F 2212/222* (2013.01); *G06F 2212/604* (2013.01); *H04L 67/1097* (2013.01)

(58) Field of Classification Search
CPC ............... G06F 11/108; G06F 12/0866; G06F 12/0804; G06F 13/28; G06F 13/4022; G06F 2212/2022; G06F 3/0656; G06F 3/0688; G06F 2211/103; H04L 12/403; H04L 12/4625; H04L 67/1097; H05K 7/1444

See application file for complete search history.

(56) References Cited

U.S. PATENT DOCUMENTS 6,516,380 B2 * 2/2003 Kenchammana-Hoskote ............
G06F 12/0804
711/113

* cited by examiner

*Primary Examiner* — Michael Alsip
(74) *Attorney, Agent, or Firm* — Kunzler Bean & Adamson, PC

(57) ABSTRACT

Apparatuses, systems, methods, and computer program products are disclosed for destaging cached data. A method includes caching write in a nonvolatile solid-state cache by appending the data to a log of the nonvolatile solid-state cache. The log includes a sequential, log-based structure preserved in the nonvolatile solid-state cache. A method includes destaging at least a portion of the data from the nonvolatile solid-state cache to the backing store in a cache log order. The cache log order comprises an order in which the data was appended to the log of the nonvolatile solid-state cache.

19 Claims, 15 Drawing Sheets

Related U.S. Application Data continuation-in-part of application No. 11/952,123, filed on Dec. 6, 2007, now Pat. No. 8,019,938, which is a continuation-in-part of application No. 12/877,971, filed on Sep. 8, 2010, now Pat. No. 8,719,501.

(60) Provisional application No. 61/435,192, filed on Jan. 21, 2011, provisional application No. 61/373,271, filed on Aug. 12, 2010, provisional application No. 60/974,470, filed on Sep. 22, 2007, provisional application No. 60/873,111, filed on Dec. 6, 2006, provisional application No. 61/240,966, filed on Sep. 9, 2009, provisional application No. 61/240,573, filed on Sep. 8, 2009.

(51) Int. Cl.
    *G06F 13/28*     (2006.01)
    *G06F 13/40*     (2006.01)
    *H04L 29/08*     (2006.01)
    *G06F 3/06*     (2006.01)

APPARATUS, SYSTEM, AND METHOD FOR DESTAGING CACHED DATA

CROSS-REFERENCE TO RELATED APPLICATIONS

This application claims priority to and is a continuation of U.S. patent application Ser. No. 13/088,211 entitled "APPARATUS, SYSTEM, AND METHOD FOR DESTAGING CACHED DATA" filed on Apr. 15, 2011, and which claims priority to: U.S. Provisional Patent Application No. 61/435,192 entitled "APPARATUS, SYSTEM, AND METHOD FOR DESTAGING CACHED DATA" filed on Jan. 21, 2011 for David Atkisson et. al; U.S. Provisional Patent Application No. 61/373,271 entitled "APPARATUS, SYSTEM, AND METHOD FOR CACHING DATA" filed on Aug. 12, 2010 for David Flynn; U.S. patent application Ser. No. 11/952,123 entitled "APPARATUS, SYSTEM, AND METHOD FOR SOLID-STATE STORAGE AS CACHE FOR HIGH-CAPACITY, NONVOLATILE STORAGE" filed on Dec. 6, 2007 for David Flynn et. al and issued as U.S. Pat. No. 8,019,938 on Sep. 13, 2011, and which claims priority to U.S. Provisional Patent Application No. 60/974,470 filed on Sep. 22, 2007 and to U.S. Provisional Patent Application No. 60/873,111 filed on Dec. 6, 2006; and U.S. patent application Ser. No. 12/877,971 entitled "APPARATUS, SYSTEM, AND METHOD FOR CACHING DATA ON A SOLID-STATE STORAGE DEVICE" filed on Sep. 8, 2010 for David Flynn et. al and issued as U.S. Pat. No. 8,719,501 on May 6, 2014, and which claims priority to U.S. Provisional Patent Application No. 61/373,271 filed on Aug. 12, 2010, U.S. Provisional Patent Application No. 61/240,966 filed on Sep. 9, 2009, and to U.S. Provisional Patent Application No. 61/240,573 filed on Sep. 8, 2009, each of which are incorporated herein by reference.

FIELD

The subject matter disclosed herein relates to caching data and more particularly relates to destaging cached data.

BACKGROUND

Description of the Related Art

For write-back caches, write data stored in the cache is written back to an associated backing store to persist the data in the backing store. The rate and the timing with which cached data is written to a backing store can affect the operation and the efficiency of a cache, because data that is not yet stored in the backing store cannot be evicted from the cache without losing the data. Attributes of a backing store can also affect the rate and the timing with which cached data can be written to the backing store.

BRIEF SUMMARY

From the foregoing discussion, it should be apparent that a need exists for an apparatus, system, and method that destage cached data from a cache to a backing store. Beneficially, such an apparatus, system, and method would account for attributes of the cache and of the backing store.

The present invention has been developed in response to the present state of the art, and in particular, in response to the problems and needs in the art that have not yet been fully solved by currently available data caches. Accordingly, the present invention has been developed to provide an apparatus, system, and method for destaging cached data that overcome many or all of the above-discussed shortcomings in the art.

Methods are presented for destaging cached data. In one embodiment a method includes detecting caching write data in a nonvolatile solid-state cache by appending the data to a log of the nonvolatile solid-state cache. The log, in one embodiment, includes a sequential, log-based structure preserved in the nonvolatile solid-state cache. In a further embodiment, a method includes destaging at least a portion of the data from the nonvolatile solid-state cache to the backing store in a cache log order. The cache log order, in one embodiment, includes an order in which the data was appending to the log of the nonvolatile solid-state cache.

In another embodiment, the method includes destaging at least a portion of the data from the nonvolatile solid-state cache to the backing store in a sequential backing store address order. The method, in one embodiment, includes determining a destaging pressure for the nonvolatile solid-state cache. In a further embodiment, the destaging pressure includes a level of demand for destaging cached data of the nonvolatile solid-state cache. In one embodiment, the method includes adjusting a destaging rate to satisfy the destaging pressure by adjusting a ratio of data to destage in the cache log order to data to destage in the sequential backing store address order. In another embodiment, the method includes preventing destaging of data within a predefined distance of an append point of the log of the nonvolatile solid-state cache.

The sequential backing store address order, in one embodiment, includes one or more ranges of address contiguous data in a range that is sequentially ordered by backing store address. Destaging data in sequential backing store address order, in a further embodiment, includes traversing a mapping structure that maps backing store addresses to locations on physical storage media of the nonvolatile solid-state cache. Destaging data in sequential backing store address order, in a further embodiment, includes selecting a destage data range such that members of the data range have contiguous and sequential backing store addresses.

In one embodiment, each backing store address directly maps to a logical address of the nonvolatile solid-state cache. In a further embodiment, logical addresses of the cache are independent of physical storage media addresses of the nonvolatile solid-state cache. A logical address space of the nonvolatile solid-state cache, in another embodiment, exceeds a storage capacity of the physical storage media of the nonvolatile solid-state cache.

The nonvolatile solid-state cache, in one embodiment, has a lower destage rate destaging in the cache log order than destaging in the sequential backing store address order. The backing store, in a further embodiment, has a higher write rate destaging in the sequential backing store address order than destaging in the cache log order.

Determining the destaging pressure, in one embodiment, includes determining a difference between an actual amount of dirty write data of the nonvolatile solid-state cache and a target amount of dirty write data of the nonvolatile solid-state cache. In a further embodiment, dirty write data includes write data cached in the nonvolatile solid-state cache that has not been destaged to the backing store.

Destaging in cache log order, in one embodiment, includes destaging data region by region, the regions ordered in cache log order. In a further embodiment, the method includes re-ordering data of a region to a backing store address order so that the regions destage in the cache log order and data within a region destages to the backing store in the backing store address order for addresses within a region.

In one embodiment, the log of the nonvolatile solid-state cache includes multiple append points for writing cached data. The multiple append points, in a further embodiment, include at least one append point for writing dirty data and at least one append point for writing clean data. Dirty data, in one embodiment, includes write data that has not been destaged to the backing store. Clean data, in one embodiment, includes data that is stored in the backing store.

Apparatuses to destage cached data are provided. A cache write module, in one embodiment, is configured to append data to a log of a nonvolatile solid-state device. A log, in certain embodiments, comprises a sequential, log-based structure. In a further embodiment, a destage module is configured to destage at least a portion of the data from the nonvolatile solid-state device to a backing store in a sequential, backing store address order.

The cache controller, in one embodiment, is configured to detect one or more write requests to store data in the backing store. The cache controller, in another embodiment, is configured to send the write requests to the storage controller of a nonvolatile solid-state storage device. The storage controller, in one embodiment, receives the write requests and caches the data associated with the write requests in the nonvolatile solid-state storage device by appending the data to a log of the nonvolatile solid-state storage device. In one embodiment, the log includes a sequential, log-based structure preserved in the nonvolatile solid-state storage device. The cache controller, in another embodiment, is configured to receive at least a portion of the data from the storage controller in a cache log order. In a further embodiment, the cache controller is configured to destage the data to the backing store in the cache log order. The cache log order, in one embodiment, includes an order in which the data was appended to the log of the nonvolatile solid-state storage device.

In one embodiment, the cache controller is configured to receive at least a portion of the data from the storage controller in a sequential backing store address order. The cache controller, in another embodiment, is configured to destage the data to the backing store in the sequential backing store address order. In a further embodiment, the cache controller is configured to determine a destaging pressure for the nonvolatile solid-state cache. The destaging pressure, in one embodiment, includes a level of demand for destaging cached data of the nonvolatile solid-state cache. The cache controller, in another embodiment, is configured to request the data from the storage controller in the sequential backing store address order in response to the destaging pressure satisfying a predefined destaging pressure criteria.

In one embodiment, the cache controller interfaces with the backing store controller of the backing store to destage the data to the backing store. The cache controller, the storage controller, and the backing store controller, in a certain embodiment, each include a device driver executing on a host computer system.

A system of the present invention is also presented to destage cached data. The system may be embodied by a processor, a nonvolatile solid-state storage device, a backing store, one or more communication buses, a cache controller, and a storage controller. In particular, the system, in one embodiment, includes a host computer system.

In one embodiment, the nonvolatile solid-state storage device preserves a log. The log, in one embodiment, includes a sequential, log-based structure. The nonvolatile solid-state storage device and the backing store, in a further embodiment, are in communication with the processor over the one or more communication buses.

In one embodiment, the cache controller is in communication with the backing store. The cache controller, in another embodiment, is configured to detect one or more write requests to store data in the backing store. In a further embodiment, the cache controller is configured to send the write requests to the storage controller for the nonvolatile solid-state storage device. The storage controller, in one embodiment, receives the write requests and caches the data associated with the write requests in the nonvolatile solid-state storage device. The storage controller, in a further embodiment, caches the data by appending the data to the log of the nonvolatile solid-state storage device.

The cache controller, in one embodiment, is configured to receive at least a portion of the data from the storage controller in a cache log order. In another embodiment, the cache controller is configured to destage the data to the backing store in the cache log order. The cache log order, in one embodiment, includes an order in which the data was appended to the log of the nonvolatile solid-state storage device. In another embodiment, the cache controller is configured to receive at least a portion of the data from the storage controller in a sequential backing store address order. The cache controller, in a further embodiment, is configured to destage the data to the backing store in the sequential backing store address order.

Computer program products are presented. In one embodiment, a computer program product includes a computer readable storage media storing computer usable program code executable to perform operations for destaging cached data. An operation, in certain embodiments, includes destaging a portion of data from a cache to a backing store in a cache log order in which the data was appended to a sequential log of the cache. In a further embodiment, an operation includes destaging a portion of data from a cache to a backing store in a sequential backing store address order. In another embodiment, an operation includes adjusting a destaging rate to satisfy a destaging pressure.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1A:
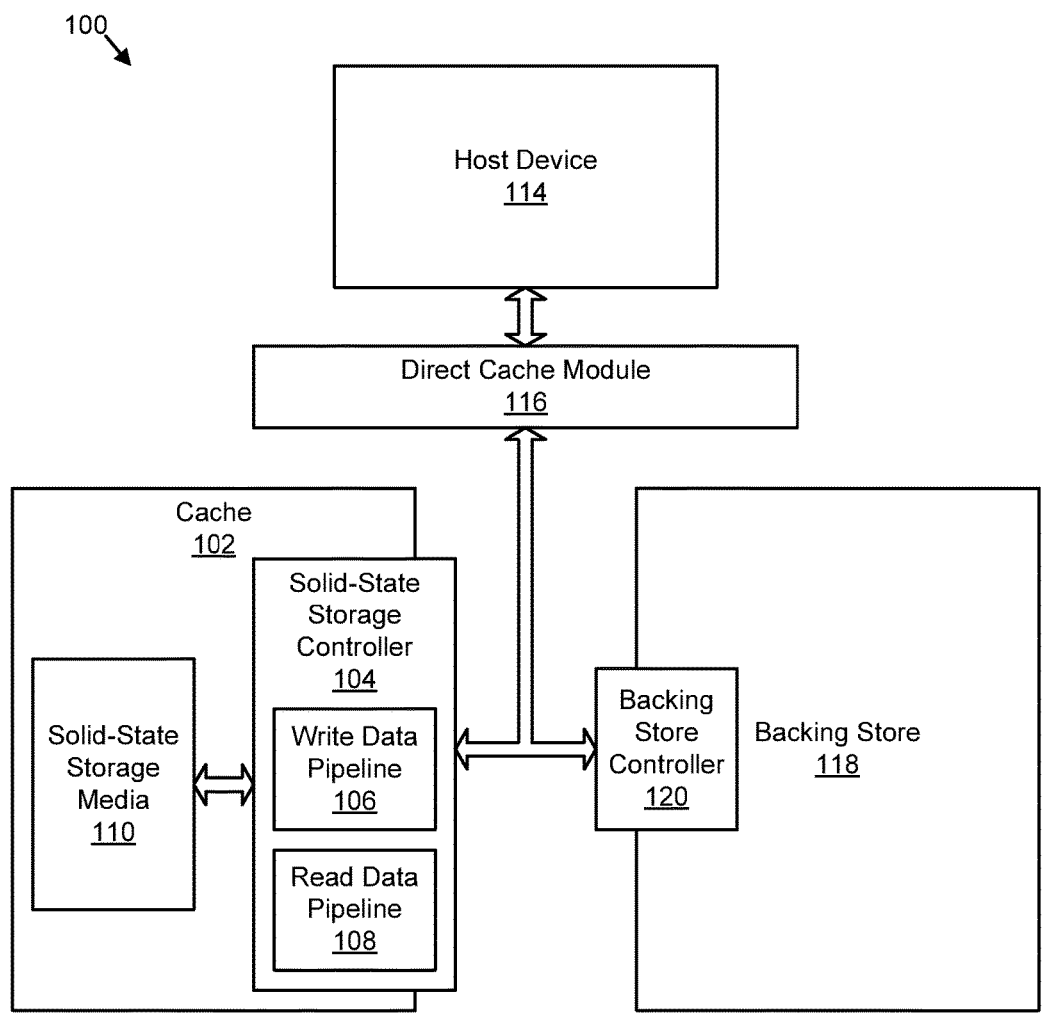
FIG. 1A is a schematic block diagram illustrating one embodiment of a system for destaging cached data in accordance with the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on or in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

Caching System

FIG. 1A depicts one embodiment of a system 100 for destaging cached data in accordance with the present invention. The system 100, in the depicted embodiment, includes a cache 102 a host device 114, a direct cache module 116, and a backing store 118. The cache 102, in the depicted embodiment, includes a solid-state storage controller 104, a write data pipeline 106, a read data pipeline 108, and a solid-state storage media 110. In general, the system 100 caches data for the backing store 118 in the cache 102 and the direct cache module 116 destages or writes cached data from the cache 102 to the backing store 118.

In the depicted embodiment, the system 100 includes a single cache 102. In another embodiment, the system 100 may include two or more caches 102. For example, in various embodiments, the system 100 may mirror cached data between several caches 102, may virtually stripe cached data across multiple caches 102, or otherwise cache data in more than one cache 102. In general, the cache 102 serves as a read and/or a write cache for the backing store 118 and the backing store 118 is a storage device that serves as a backing store for the cache 102. In one embodiment, the cache 102 operates in a write-back mode and the direct cache module 116 destages cached write data to the backing store 118 opportunistically after caching the write data in the cache 102. In certain embodiments, the cache 102 may operate, at least temporarily, in another mode, such as a write-back mode, a write-around mode, or the like, and the direct cache module 116 may write data to the backing store 118 substantially simultaneously with caching the data in the cache 102 or without caching the data in the cache 102. The direct cache module 116 destages data from the cache 102 to the backing store 118 to persist the data in the backing store 118. The direct cache module 116, in one embodiment, destages dirty write data that the backing store 118 does not yet store to clean the data. Destaging the dirty write data to the backing store 118 converts the state of the dirt write data from dirty to clean data.

In the depicted embodiment, the cache 102 is embodied by a non-volatile, solid-state storage device, with a solid-state storage controller 104 and non-volatile, solid-state storage media 110. The non-volatile, solid-state storage media 110 may include flash memory, nano random access memory ("nano RAM or NRAM"), magneto-resistive RAM ("MRAM"), dynamic RAM ("DRAM"), phase change RAM ("PRAM"), racetrack memory, memristor memory, nanocrystal wire-based memory, silicon-oxide based sub-10 nanometer process memory, graphene memory, silicon-oxide-nitride-oxide-silicon ("SON OS") memory, resistive random-access memory ("RRAM"), programmable metallization cell ("PMC"), conductive-bridging RAM ("CBRAM"), or the like. Embodiments of the cache 102 that include a solid-state storage controller 104 and solid-state storage media 110 are described in more detail with respect to FIGS. 2 and 3. In further embodiments, the cache 102 may include other types of non-volatile and/or volatile data storage, such as dynamic RAM ("DRAM"), static RAM ("SRAM"), magnetic data storage, optical data storage, and/or other data storage technologies.

The cache 102, in one embodiment, stores or preserves data in a log. The log, in a further embodiment, comprises a sequential, append-only log-based structure, or the like. The cache 102 stores at least a portion of the log on the solid-state storage media 110. The cache 102, in certain embodiments, may store a portion of the log, metadata for the log, or the like in volatile memory, such as RAM, and may store at least enough data of the log in the solid-state storage media 110 to recreate the log structure after an improper shutdown or other failure.

In one embodiment, the log includes a head at an append point and a tail at an end of the log with the oldest data (data written earliest in time). In certain embodiments, the log may include multiple append points, multiple sub-logs, or the like. In a further embodiment, the cache 102 may store or preserve data in multiple logs. The direct cache module 116, in one embodiment, destages data from the cache 102 in a cache log order. A cache log order, as used herein, is an order in which data was appended to (or is organized within) the log of the cache 102. The cache log order may be from older data toward newer data (e.g., tail to head order), from newer data toward older data (e.g., head to tail order), or the like.

In one embodiment, destaging in a tail to head cache log order may reduce write amplification by destaging older data that is more likely to be stored in a region that is a candidate for grooming/garbage collection. Write amplification is the rewriting or moving of data during a grooming or garbage collection process, causing data originally written in response to a user write request to be written more than once. Write amplification can increase the number of writes of a storage device, consume write bandwidth of a storage device, reduce a usable lifetime of a storage device, and otherwise reduce performance of a storage device. Once the direct cache module 116 has destaged dirty write data to the backing store 118, the data is clean and the direct cache module 116 may selectively clear, invalidate, and/or evict the data, which is now clean, from the cache 102, instead of writing the data forward during a grooming/garbage collection operation.

In general, the cache 102 caches data for the backing store 118. The backing store 118, in one embodiment, is a backing store associated with the cache 102 and/or with the direct cache module 116. The backing store 118 may include a hard disk drive, an optical drive with optical media, a magnetic tape drive, or another type of storage device. In one embodiment, the backing store 118 may have a greater data storage capacity than the cache 102. In another embodiment, the backing store 118 may have a higher latency, a lower throughput, or the like, than the cache 102.

The backing store 118 may have a higher latency, a lower throughput, or the like due to properties of the backing store 118 itself, or due to properties of a connection to the backing store 118. For example, in one embodiment, the cache 102 and the backing store 118 may each include non-volatile, solid-state storage media 110 with similar properties, but the backing store 118 may be in communication with the host device 114 over a data network, while the cache 102 may be directly connected to the host device 114, causing the backing store 118 to have a higher latency relative to the host 114 than the cache 102.

In one embodiment, the backing store 118 stores data more quickly and/or more efficiently when the backing store 118 receives the data in a sequential, backing store address order than when the backing store 118 receives the data out of order. In a further embodiment, the backing store 118 has a higher write rate writing data in a backing store address order than when writing data out of backing store address order. For example, in certain embodiments, the backing store 118 may include a magnetic or optical read/write head and may incur a seek time from moving the head between out of order addresses. The backing store, in one embodiment, may incur little or no seek time when writing data that is sequentially ordered by backing store address.

Data in a backing store address order, in one embodiment, includes a range of data that is ordered by a logical or physical address of the data, in either increasing or decreasing order. The logical or physical address of the data, in a further embodiment, is an address associated with the backing store 118. In one embodiment, a range of data in backing store address order includes a continuous, unbroken range of data with consecutive backing store addresses. In another embodiment, a range of data in backing store address order may have one or more holes or gaps, with missing addresses, such that the backing store addresses of the range of data are ordered, but may not necessarily be consecutive.

As described above, in one embodiment, the direct cache module 116 destages data from the cache 102 to the backing store 118 in a cache log order. In another embodiment, the direct cache module 116 destages data from the cache 102 to the backing store 118 in a sequential backing store address order. In a further embodiment, the direct cache module 116 destages data from the cache 102 in both a cache log order and a backing store address order.

In certain embodiments, the direct cache module 116 can provide a higher destage rate destaging data in a sequential backing store address order than in a cache log order, due to more efficient write rates of the backing store 118, or the like. The direct cache module 116, in other embodiments, can destage data more efficiently for the cache 102 in a cache log order, as described above. The direct cache module 116, in one embodiment, balances destaging in cache log order and in backing store address order.

In various embodiments, the direct cache module 116 may destage data in both a cache log order and a backing store address order in parallel, by alternating between a cache log order and a backing store address order, or the like. The direct cache module 116, in one embodiment, determines a ratio, duty cycle, or the like defining an amount of data to destage in cache log order and an amount of data to destage in backing store address order. In a further embodiment, the direct cache module 116 destages data in a backing store address order in response to a destaging rate of log order destaging failing to satisfy a target destage rate, or the like. For example, the direct cache module 116 may balance destaging orders to satisfy a destaging pressure or a target destage rate, to maximize destaging efficiency of the cache 102, or the like.

In one embodiment, the direct cache module 116 destages dirty data from the cache 102 to the backing store 118 in an order that favors operation of the cache 102, the order selected such that cache operation is more efficient following destaging. One example of an order that favors operation of the cache 102 is cache log order destaging in the same order in which the data was appended to the log of the cache 102. Log ordered destaging is one embodiment of an elevator algorithm. The direct cache module 116 may use other kinds of elevator algorithms that may produce higher destage rates and still favor operation of the cache 102.

In one embodiment, the direct cache module 116 destages dirty data from the cache 102 to the backing store 118 in an order that favors operation of the backing store, the order selected such that backing store operation is more efficient during and/or following the destaging. One example of an order that favors operation of the backing store is destaging in a sequential backing store address order.

In one embodiment, the direct cache module 116 destages dirty data from the cache 102 to the backing store 118 in an order that favors management of the nonvolatile solid-state storage media, the order selected such that management of the nonvolatile solid-state storage media is more efficient following the destaging. For example, the direct cache module 116 may destage first a region of the cache 102, such as an erase block, with the least amount of dirty data or may destage first a region of the cache 102, such as an erase block, that will have the lowest grooming cost once the region is cleaned. In one embodiment, the direct cache module 116 may destage data from the cache 102 in an order based on the amount of dirty data (for example the least dirty data may have a lowest cost and may have the highest likelihood of being groomed next). For logical erase blocks ("LEBs") or other regions not in the hot zone (i.e. at least X LEBS from an append point of the log) the amount of dirty data then, in certain embodiments, may be a dominant factor in determining destaging order. In another embodiment, the direct cache module 116 may destage data from the cache 102 in an order of the LEBs based on the cost to groom the LEB if only the LEB were clean (so the LEB is known to have dirty data)—assuming the LEB was all clean. In this embodiment, the direct cache module 116 may then order destaging in a manner that gets a next best grooming candidate ready the fastest.

The direct cache module 116, in one embodiment, may use a combination of several destaging orders or destaging order algorithms and/or may alternate between destaging orders to favor operation of the cache 102, to favor operation of the backing store, and/or to favor operation of the solid-state storage media 110 to various degrees or at various times. In other embodiments, the direct cache module 116 may use a single destaging order, or the like.

In one embodiment, the cache 102 and/or the backing store 118 are in communication with a processor of the host device 114 over one or more communications buses. In the depicted embodiment, the cache 102 and the backing store 118 are in communication with the host device 114 through the direct cache module 116. The cache 102 and/or the backing store 118, in one embodiment, may be direct attached storage ("DAS") of the host device 114. DAS, as used herein, is data storage that is connected to a device, either internally or externally, without a storage network in between.

In one embodiment, the cache 102 and/or the backing store 118 are internal to the host device 114 and are connected using a system bus, such as a peripheral component interconnect express ("PCI-e") bus, a Serial Advanced Technology Attachment ("SATA") bus, or the like. In another embodiment, the cache 102 and/or the backing store 118 may be external to the host device 114 and may be connected using a universal serial bus ("USB") connection, an Institute of Electrical and Electronics Engineers ("IEEE") 1394 bus ("Fire Wire"), an external SATA ("eSATA") connection, or the like. In other embodiments, the cache 102 and/or the backing store 118 may be connected to the host device 114 using a peripheral component interconnect ("PCI") express bus using external electrical or optical bus extension or bus networking solution such as Infiniband or PCI Express Advanced Switching ("PCIe-AS"), or the like.

In various embodiments, the cache 102 and/or the backing store 118 may be in the form of a dual-inline memory module ("DIMM"), a daughter card, or a micro-module. In another embodiment, the cache 102 and/or the backing store 118 may be elements within a rack-mounted blade. In another embodiment, the cache 102 and/or the backing store 118 may be contained within packages that are integrated directly onto a higher level assembly (e.g. mother board, lap top, graphics processor). In another embodiment, individual components comprising the cache 102 and/or the backing store 118 are integrated directly onto a higher level assembly without intermediate packaging.

In the depicted embodiment, the cache 102 includes one or more solid-state storage controllers 104 with a write data pipeline 106 and a read data pipeline 108, and a solid-state storage media 110, which are described in more detail below with respect to FIGS. 2 and 3. The backing store 118, in the depicted embodiment, includes a backing store controller 120. The solid-state storage controller 104 and the backing store controller 120, in certain embodiments, may receive storage requests, perform management functions and the like for the cache 102 and the backing store 118, or perform other functions. The solid-state storage controller 104 and/or the backing store controller 120, in various embodiments, may comprise one or more device drivers installed on the host device 114, logic hardware or firmware of the cache 102 and/or the backing store 118, a combination of one or more device drivers and logic hardware or firmware, or the like.

In a further embodiment, instead of being connected directly to the host device 114 as DAS, the cache 102 and/or the backing store 118 may be connected to the host device 114 over a data network. For example, the cache 102 and/or the backing store 118 may include a storage area network ("SAN") storage device, a network attached storage ("NAS") device, a network share, or the like. In one embodiment, the system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 114 and the cache 102 and/or the backing store 118.

In one embodiment, at least the cache 102 is connected directly to the host device 114 as a DAS device. In a further embodiment, the cache 102 is directly connected to the host device 114 as a DAS device and the backing store 118 is directly connected to the cache 102. For example, the cache 102 may be connected directly to the host device 114, and the backing store 118 may be connected directly to the cache 102 using a direct, wire-line connection, such as a PCI express bus, an SATA bus, a USB connection, an IEEE 1394 connection, an eSATA connection, a proprietary direct connection, an external electrical or optical bus extension or bus networking solution such as Infiniband or PCIe-AS, or the like. One of skill in the art, in light of this disclosure, will recognize other arrangements and configurations of the host device 114, the cache 102, and the backing store 118 suitable for use in the system 100.

The system 100 includes the host device 114 in communication with the cache 102 and the backing store 118 through the direct cache module 116. A host device 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like.

In the depicted embodiment, the host device 114 is in communication with the direct cache module 116. The direct cache module 116, in general, receives or otherwise detects read and write requests from the host device 114 directed to the backing store 118 and manages the caching of data in the cache 102 and destaging of cached data to the backing store 118. In one embodiment, the direct cache module 116 comprises a software application, file system filter driver, combination of filter drivers, or the like on the host device 114.

Figure 1B:
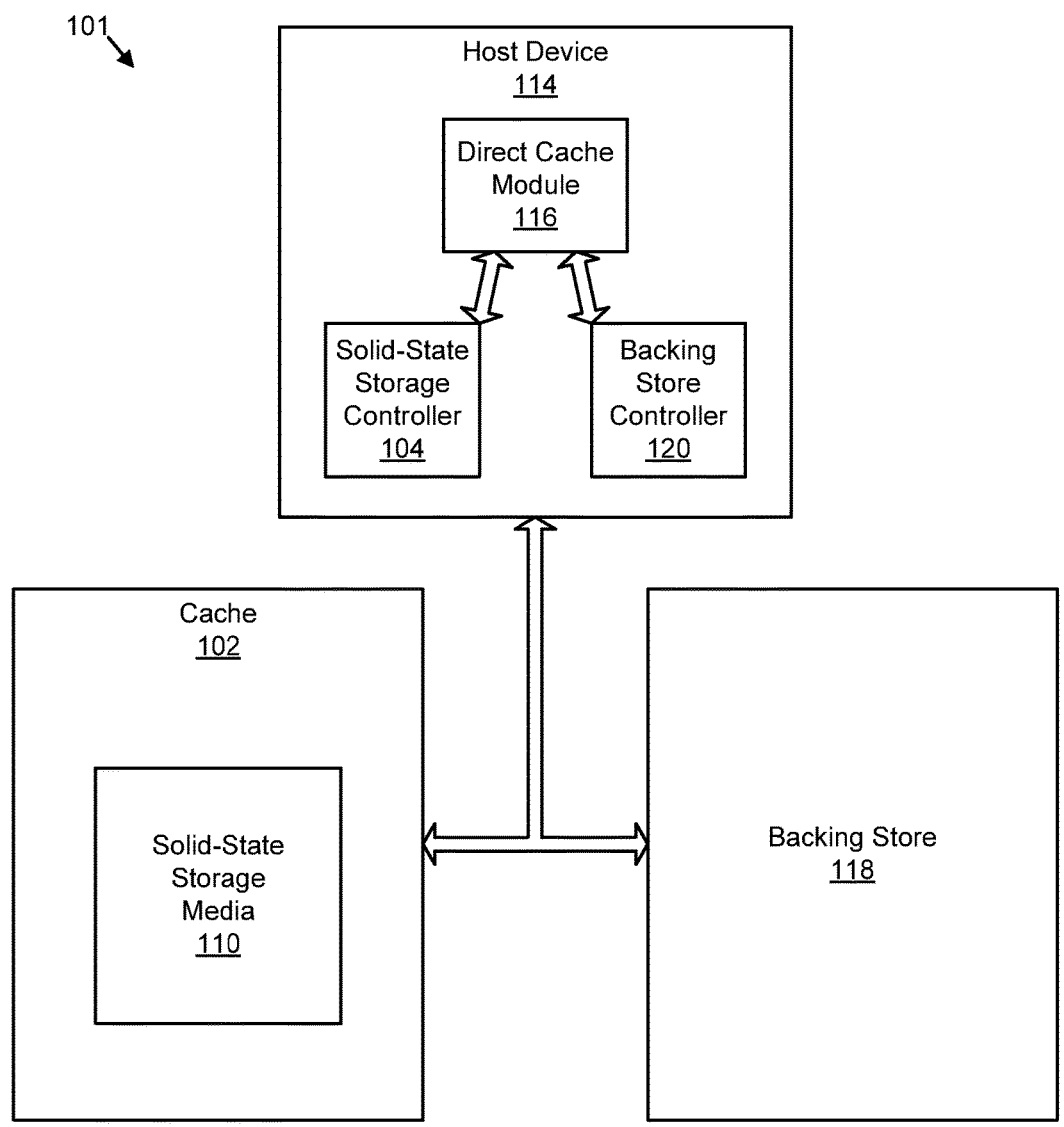
FIG. 1B is a schematic block diagram illustrating another embodiment of a system for destaging cached data in accordance with the present invention.

In another embodiment, the direct cache module 116 comprises one or more storage controllers, such as the solid-state storage controller 104 of the cache 102 and/or the backing store controller 120 of the backing store 118. FIG. 1B depicts a system 101 that is substantially similar to the system 100 of FIG. 1A, but with the storage controller 104 and the backing store controller 120 integrated with the direct cache module 116 as device drivers and/or filter drivers on the host device 114. The storage controller 104 and the backing store controller 120 may be integrated with the direct cache module 116 as device drivers on the host device 114, as dedicated hardware logic circuits or firmware of the cache 102 and/or the backing store 118, as a combination of one or more device drivers and dedicated hardware, or the like. In a further embodiment, the direct cache module 116 comprises a combination of one or more software drivers of the host device 114 and one or more storage controllers, or the like. The direct cache module 116, in various software, hardware, and combined software and hardware embodiments, may generally be referred to as a cache controller.

In one embodiment, the host device 114 loads one or more device drivers for the cache 102 and/or the backing store 118 and the direct cache module 116 communicates with the one or more device drivers on the host device 114. As described above, in certain embodiments, the solid-state storage controller 104 of the cache 102 and/or the backing store controller 120 may comprise device drivers on the host device 114. In another embodiment, the direct cache module 116 may communicate directly with a hardware interface of the cache 102 and/or the backing store 118. In a further embodiment, the direct cache module 116 may be integrated with the cache 102 and/or the backing store 118.

In one embodiment, the cache 102 and/or the backing store 118 have block device interfaces that support block device commands. For example, the cache 102 and/or the backing store 118 may support the standard block device interface, the A TA interface standard, the ATA Packet Interface ("ATAPI") standard, the small computer system interface ("SCSI") standard, and/or the Fibre Channel standard which are maintained by the InterNational Committee for Information Technology Standards ("INCITS"). The direct cache module 116 may interact with the cache 102 and/or the backing store 118 using block device commands to read, write, and clear (or trim) data. In one embodiment, the solid-state storage controller 104 and/or the backing store controller 120 provide block device interfaces to the direct cache module 116.

In one embodiment, the direct cache module 116 serves as a proxy for the backing store 118, receiving read and write requests for the backing store 118 directly from the host device 114. The direct cache module 116 may represent itself to the host device 114 as a storage device having a capacity similar to and/or matching the capacity of the backing store 118. The direct cache module 116, upon receiving a read request or write request from the host device 114, in one embodiment, fulfills the request by caching write data in the cache 102 or by retrieving read data from one of the cache 102 and the backing store 118 and returning the read data to the host device 114.

Data caches are typically organized into cache lines which divide up the physical capacity of the cache, these cache lines may be divided into several sets. A cache line is typically larger than a block or sector of a backing store associated with a data cache, to provide for prefetching of additional blocks or sectors and to reduce cache misses and increase the cache hit rate. Data caches also typically evict an entire, fixed size, cache line at a time to make room for newly requested data in satisfying a cache miss. Data caches may be direct mapped, fully associative, N-way set associative, or the like.

In a direct mapped cache, each block or sector of a backing store has a one-to-one mapping to a cache line in the direct mapped cache. For example, if a direct mapped cache has T number of cache lines, the backing store associated with the direct mapped cache may be divided into T sections, and the direct mapped cache caches data from a section exclusively in the cache line corresponding to the section. Because a direct mapped cache always caches a block or sector in the same location or cache line, the mapping between a block or sector address and a cache line can be a simple manipulation of an address of the block or sector.

In a fully associative cache, any cache line can store data from any block or sector of a backing store. A fully associative cache typically has lower cache miss rates than a direct mapped cache, but has longer hit times (i.e., it takes longer to locate data in the cache) than a direct mapped cache. To locate data in a fully associative cache, either cache tags of the entire cache can be searched, a separate cache index can be used, or the like.

In an N-way set associative cache, each sector or block of a backing store may be cached in any of a set of N different cache lines. For example, in a 2-way set associative cache, either of two different cache lines may cache data for a sector or block. In an N-way set associative cache, both the cache and the backing store are typically divided into sections or sets, with one or more sets of sectors or blocks of the backing store assigned to a set of N cache lines. To locate data in an N-way set associative cache, a block or sector address is typically mapped to a set of cache lines, and cache tags of the set of cache lines are searched, a separate cache index is searched, or the like to determine which cache line in the set is storing data for the block or sector. An N-way set associative cache typically has miss rates and hit rates between those of a direct mapped cache and those of a fully associative cache.

The cache 102, in one embodiment, may have characteristics of both a directly mapped cache and a fully associative cache. A logical address space of the cache 102, in one embodiment, is directly mapped to an address space of the backing store 118 while the physical storage media 110 of the cache 102 is fully associative with regard to the backing store 118. In other words, each block or sector of the backing store 118, in one embodiment, is directly mapped to a single logical address of the cache 102 while any portion of the physical storage media 110 of the cache 102 may store data for any block or sector of the backing store 118. In one embodiment, a logical address is an identifier of a block of data and is distinct from a physical address of the block of data, but may be mapped to the physical address of the block of data. Examples of logical addresses, in various embodiments, include logical block addresses ("LBAs"), logical identifiers, object identifiers, pointers, references, and the like.

Instead of traditional cache lines, in one embodiment, the cache 102 has logical or physical cache data blocks associated with logical addresses that are equal in size to a block or sector of the backing store 118. In a further embodiment, the cache 102 caches ranges and/or sets of ranges of blocks or sectors for the backing store 118 at a time, providing dynamic or variable length cache line functionality. A range or set of ranges of blocks or sectors, in a further embodiment, may include a mixture of contiguous and/or noncontiguous blocks. For example, the cache 102, in one embodiment, supports block device requests that include a mixture of contiguous and/or noncontiguous blocks and that may include "holes" or intervening blocks that the cache 102 does not cache or otherwise store.

In one embodiment, one or more groups of logical addresses of the cache 102 are directly mapped to corresponding logical addresses of the backing store 118. Directly mapping logical addresses of the cache 102 to logical addresses of the backing store 118, in one embodiment, provides a one-to-one relationship between the logical addresses of the backing store 118 and the logical addresses of the cache 102. Directly mapping logical addresses of the cache 102 to the logical or physical address space of the backing store 118, in one embodiment, precludes the use of an extra translation layer in the direct cache module 116, such as the use of cache tags, a cache index, the maintenance of a translation data structure, or the like. In one embodiment, while the logical address space of the cache 102 may be larger than a logical address space of the backing store 118, both logical address spaces include at least logical addresses 0-N. In a further embodiment, at least a portion of the logical address space of the cache 102 represents or appears as the logical address space of the backing store 118 to a client, such as the host device 114.

Alternatively, in certain embodiments where physical blocks or sectors of the backing store 118 are directly accessible using physical addresses, at least a portion of logical addresses in a logical address space of the cache 102 may be mapped to physical addresses of the backing store 118. At least a portion of the logical address space of the cache 102, in one embodiment, may correspond to the physical address space of the backing store 118. At least a subset of the logical addresses of the cache 102, in this embodiment, is directly mapped to corresponding physical addresses of the backing store 118.

In one embodiment, the logical address space of the cache 102 is a sparse address space that is either as large as or is larger than the physical storage capacity of the cache 102. This allows the backing store 118 to have a larger storage capacity than the cache 102, while maintaining a direct mapping between the logical addresses of the cache 102 and logical or physical addresses of the backing store 118. The sparse logical address space may be thinly provisioned, in one embodiment. In a further embodiment, as the direct cache module 116 writes data to the cache 102 using logical addresses, the cache 102 directly maps the logical addresses to distinct physical addresses or locations on the solid-state storage media 110 of the cache 102, such that the physical addresses or locations of data on the solid-state storage media 110 are fully associative with the backing store 118.

In one embodiment, the direct cache module 116 and/or the cache 102 use the same mapping structure to map addresses (either logical or physical) of the backing store 118 to logical addresses of the cache 102 and to map logical addresses of the cache 102 to locations/physical addresses of a block or sector (or range of blocks or sectors) on the physical solid-state storage media 110. In one embodiment, using a single mapping structure for both functions eliminates the need for a separate cache map, cache index, cache tags, or the like, decreasing access times of the cache 102.

In a further embodiment, the direct cache module 116 uses the same mapping structure that maps logical addresses of the cache 102 to locations on the physical solid-state storage media 110 to locate ranges of data to destage in a backing store address order.

Once the direct cache module 116 has destaged dirty data from the cache 102, the data is clean and the direct cache module 116 may clear, trim, replace, expire, and/or evict the data from the cache 102 and the physical addresses and associated physical storage media 110 may be freed to store data for other logical addresses. In one embodiment, as described above, the solid state storage controller 104 stores data at physical addresses using a log-based, append-only writing structure such that data evicted from the cache 102 or overwritten by a subsequent write request invalidates other data in the log. Consequently, a garbage collection or grooming process recovers the physical capacity of the invalid data in the log. One embodiment of the log-based, append only writing structure is logically ring-like data structure, as new data is appended to the log-based writing structure, previously used physical capacity is reused in a circular, theoretically infinite manner.

Solid-State Storage Device

Figure 2:
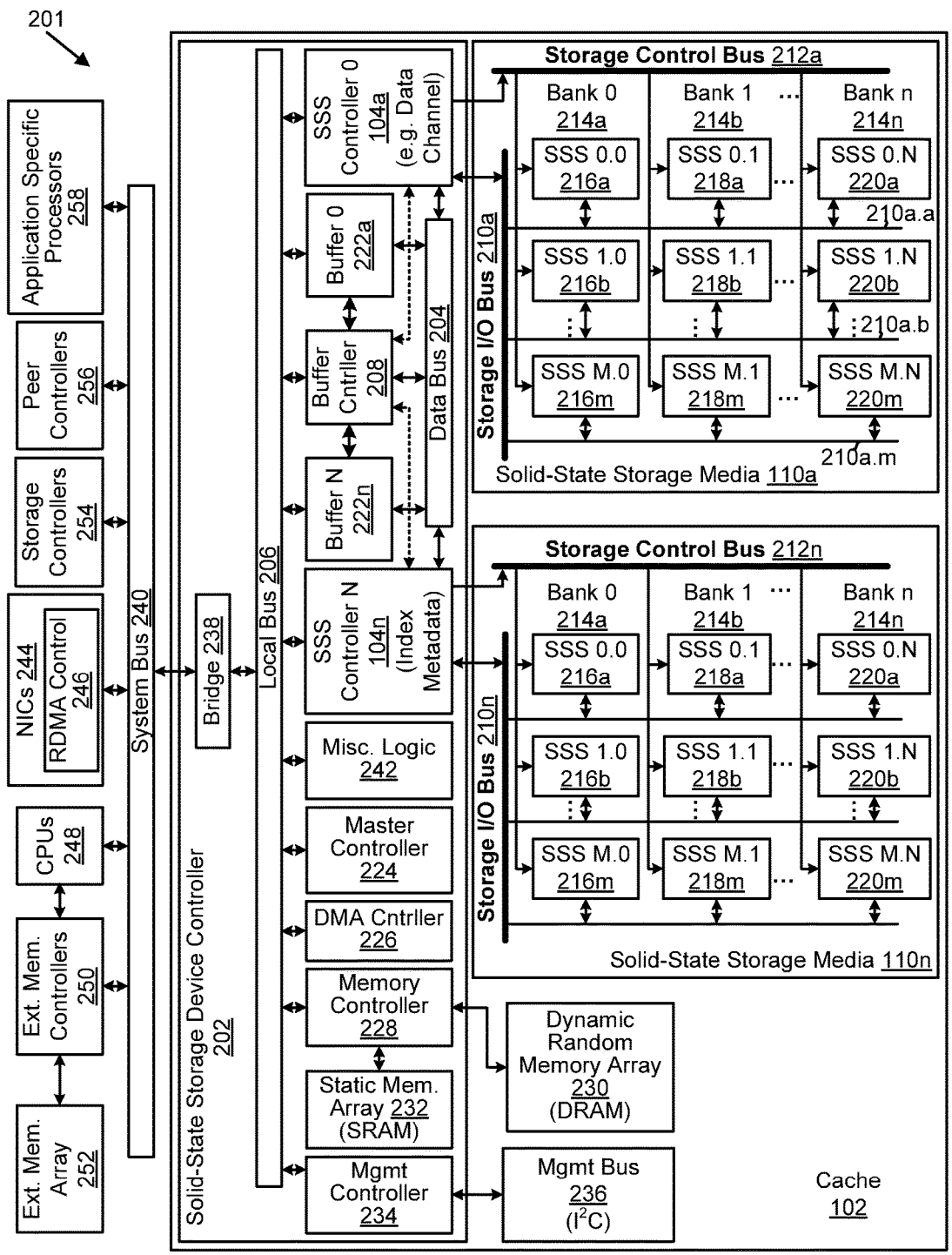
FIG. 2 is a schematic block diagram illustrating one embodiment of a solid-state storage device controller in a cache device in accordance with the present invention.

FIG. 2 is a schematic block diagram illustrating one embodiment 201 of a solid-state storage device controller 202 that includes a write data pipeline 106 and a read data pipeline 108 in a cache 102 in accordance with the present invention. The solid-state storage device controller 202 may be embodied as hardware, as software, or as a combination of hardware and software.

The solid-state storage device controller 202 may include a number of solid-state storage controllers 0-N 104*a-n*, each controlling solid-state storage media 110. In the depicted embodiment, two solid-state controllers are shown: solid-state controller 0 104*a* and solid-state storage controller N 104*n*, and each controls solid-state storage media 110*a-n*. In the depicted embodiment, solid-state storage controller O 104*a* controls a data channel so that the attached solid-state storage media 111*a* stores data. Solid-state storage controller N 104*n* controls an index metadata channel associated with the stored data and the associated solid-state storage media 110*n*, stores index metadata. In an alternate embodiment, the solid-state storage device controller 202 includes a single solid-state controller 104*a* with a single solid-state storage media 110*a*. In another embodiment, there are a plurality of solid-state storage controllers 104*a-n* and associated solid-state storage media 110*a-n*. In one embodiment, one or more solid-state controllers 104*a*-104*n*-1, coupled to their associated solid-state storage media 110*a*-110*n*-1, control data while at least one solid-state storage controller 104*n*, coupled to its associated solid-state storage media 110*n*, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216*a*) is typically configured as a chip (a package of one or more dies) or a die on a circuit board. As depicted, a solid-state storage element (e.g. 216*a*) operates independently or semi-independently of other solid-state storage elements (e.g. 218*a*) even if these several elements are packaged together in a chip package, a stack of chip packages, or some other package element. As depicted, a column of solid-state storage elements 216, 218, 220 is designated as a bank 214. As depicted, there may be "n" banks 214*a-n* and "m" solid-state storage elements 216*a-m*, 218*a-m*, 220*a-m* per bank in an array of n×m solid-state storage elements 216, 218, 220 in a solid-state storage media 110. In one embodiment, a solid-state storage media 110*a* includes twenty solid-state storage elements per bank (e.g. 216*a-m* in bank 214*a*, 218*a*-min bank 214*b*, 220*a*-min bank 214*n*, where m=22) with eight banks (e.g. 214*a-n* where n=8) and a solid-state storage media 110*n* includes two solid-state storage elements (e.g. 216*a-m* where m=2) per bank 214 with one bank 214*a*. There is no requirement that two solid-state storage media 110*a*, 110*n* have the same number of solid-state storage elements and/or same number of banks 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210*a* row (e.g. 216*b*, 218*b*, 220*b*) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216*a*) may have one or more virtual dies per die and one or more dies per chip and one or more chips stacked vertically and each virtual die may be accessed independently. In another embodiment, a solid-state storage element SSS 0.0 216*a* may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216*a*-220*a*, each in a separate bank 214*a-n*. In another embodiment, 20 storage elements (e.g. SSS 0.0-SSS 20.0) 216 form a virtual bank 214*a* so that each of the eight virtual banks has 20 storage elements (e.g. SSS0.0-SSS 20.8). Data is sent to the solid-state storage media 110 over the storage I/O bus 210 to all storage elements of a particular group of storage elements (SSS 0.0-SSS 0.8) 216*a*, 218*a*, 220*a*. The storage control bus 212a is used to select a particular bank (e.g. Bank-0 214a) so that the data received over the storage I/O bus 210 connected to all banks 214 is written just to the selected bank 214a.

In certain embodiments, the storage control bus 212 and storage I/O bus 210 are used together by the solid-state controller 104 to communicate addressing information, storage element command information, and data to be stored. Those of skill in the art recognize that this address, data, and command information may be communicated using one or the other of these buses 212, 210, or using separate buses for each type of control information. In one embodiment, addressing information, storage element command information, and storage data travel on the storage I/O bus 210 and the storage control bus 212 carries signals for activating a bank as well as identifying whether the data on the storage I/O bus 210 lines constitute addressing information, storage element command information, or storage data.

For example, a control signal on the storage control bus 212 such as "command enable" may indicate that the data on the storage I/O bus 210 lines is a storage element command such as program, erase, reset, read, and the like. A control signal on the storage control bus 212 such as "address enable" may indicate that the data on the storage I/O bus 210 lines is addressing information such as erase block identifier, page identifier, and optionally offset within the page within a particular storage element. Finally, an absence of a control signal on the storage control bus 212 for both "command enable" and "address enable" may indicate that the data on the storage I/O bus 210 lines is storage data that is to be stored on the storage element at a previously addressed erase block, physical page, and optionally offset within the page of a particular storage element.

In one embodiment, the storage I/O bus 210 is comprised of one or more independent I/O buses ("IIOBa-m" comprising 210a.a-m, 210n.a-m) wherein the solid-state storage elements within each row share one of the independent I/O buses across each solid-state storage element 216, 218, 220 in parallel so that all banks 214 are accessed simultaneously. For example, one IIOB 210a.a of the storage I/O bus 210 may access a first solid-state storage element 216a, 218a, 220a of each bank 214a-n simultaneously. A second IIOB 210a.b of the storage I/O bus 210 may access a second solid-state storage element 216b, 218b, 220b of each bank 214a-n simultaneously. Each row of solid-state storage elements 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220 using either of the chip select signal and the chip enable signal. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element has a page size of 4 kB. A single bank 214a of 20 solid-state storage elements 216a-m would then have an 80 kB capacity of pages accessed with the same address going out of the storage I/O bus 210.

This group of pages in a bank 214 of solid-state storage elements 216, 218, 220 of 80 kB may be called a logical or virtual page. Similarly, an erase block of each storage element 216a-m of a bank 214a may be grouped to form a logical erase block. In one embodiment, erasing a logical erase block causes a physical erase block ("PEB") of each storage element 216a-m of a bank 214a to be erased. In one embodiment, an erase block of pages within a solid-state storage element 216, 218, 220 is erased when an erase command is received within a solid-state storage element 216, 218, 220. In another embodiment, a single physical erase block on each storage element (e.g. SSS M.N) collectively forms a logical erase block for the solid-state storage media 110a. In such an embodiment, erasing a logical erase block comprises erasing an erase block at the same address within each storage element (e.g. SSS M.N) in the solid-state storage media 110a. Whereas the size and number of erase blocks, pages, planes, or other logical and physical divisions within a solid-state storage element 216, 218, 220 may change over time with advancements in technology, it is to be expected that many embodiments consistent with new configurations are possible and are consistent with the general description herein.

In one embodiment, data is written in packets to the storage elements. The solid-state controller 104 uses the storage I/O bus 210 and storage control bus 212 to address a particular bank 214, storage element 216, 218, 220, physical erase block, physical page, and optionally offset within a physical page for writing the data packet. In one embodiment, the solid-state controller 104 sends the address information for the data packet by way of the storage I/O bus 210 and signals that the data on the storage I/O bus 210 is address data by way of particular signals set on the storage control bus 212. The solid-state controller 104 follows the transmission of the address information with transmission of the data packet of data that is to be stored. The physical address contains enough information for the solid-state storage element 216, 218, 220 to direct the data packet to the designated location within the page.

In one embodiment, the storage I/O bus 210a.a connects to each storage element in a row of storage elements (e.g. SSS 0.0-SSS O.N 216a, 218a, 220a). In such an embodiment, the solid-state controller 104a activates a desired bank 214a using the storage control bus 212a, such that data on storage I/O bus 210a.a reaches the proper page of a single storage element (e.g. SSS 0.0 216a).

In addition, in certain embodiments, the solid-state controller 104a simultaneously activates the same bank 214a using the storage control bus 212a, such that different data (a different data packet) on storage I/O bus 210a. breaches the proper page of a single storage element on another row (e.g. SSS 1.0 216b). In this manner, multiple physical pages of multiple storage elements 216, 218, 220 may be written to simultaneously within a single bank 214 to store a logical page.

Similarly, a read command may require a command on the storage control bus 212 to select a single bank 214a and the appropriate page within that bank 214a. In one embodiment, a read command reads an entire physical page from each storage element, and because there are multiple solid-state storage elements 216, 218, 220 in parallel in a bank 214, an entire logical page is read with a read command. However, the read command may be broken into subcommands, as will be explained below with respect to bank interleave. A logical page may also be accessed in a write operation.

In one embodiment, a solid-state controller 104 may send an erase block erase command over all the lines of the storage I/O bus 210 to erase a physical erase block having a particular erase block address. In addition, the solid-state controller 104 may simultaneously activate a single bank 214 using the storage control bus 212 such that each physical erase block in the single activated bank 214 is erased as part of a logical erase block.

In another embodiment, the solid-state controller 104 may send an erase block erase command over all the lines of the storage I/O bus 210 to erase a physical erase block having a particular erase block address on each storage element 216, 218, 220 (SSS 0.0-SSS M.N). These particular physical erase blocks together may form a logical erase block. Once the address of the physical erase blocks is provided to the storage elements 216, 218, 220, the solid-state controller 104 may initiate the erase command on a bank 214a by bank 214b by bank 214n basis (either in order or based on some other sequence). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, the storage controller 104 sequentially writes data on the solid-state storage media 110 in a log structured format and within one or more physical structures of the storage elements, the data is sequentially stored on the solid-state storage media 110. Sequentially writing data involves the storage controller 104 streaming data packets into storage write buffers for storage elements, such as a chip (a package of one or more dies) or a die on a circuit board. When the storage write buffers are full, the data packets are programmed to a designated virtual or logical page ("LP"). Data packets then refill the storage write buffers and, when full, the data packets are written to the next LP. The next virtual page may be in the same bank 214a or another bank (e.g. 214b). This process continues, LP after LP, typically until a virtual or logical erase block ("LEB") is filled. LPs and LEBs are described in more detail below.

In another embodiment, the streaming may continue across LEB boundaries with the process continuing, LEB after LEB. Typically, the storage controller 104 sequentially stores data packets in an LEB by order of processing. In one embodiment, where a write data pipeline 106 is used, the storage controller 104 stores packets in the order that they come out of the write data pipeline 106. This order may be a result of data segments arriving from a requesting device mixed with packets of valid data that are being read from another storage location as valid data is being recovered from another LEB during a recovery operation.

The sequentially stored data, in one embodiment, can serve as a log to reconstruct data indexes and other metadata using information from data packet headers. For example, in one embodiment, the storage controller 104 may reconstruct a storage index by reading headers to determine the data structure to which each packet belongs and sequence information to determine where in the data structure the data or metadata belongs. The storage controller 104, in one embodiment, uses physical address information for each packet and timestamp or sequence information to create a mapping between the physical locations of the packets and the data structure identifier and data segment sequence. Timestamp or sequence information is used by the storage controller 104 to replay the sequence of changes made to the index and thereby reestablish the most recent state.

In one embodiment, erase blocks are time stamped or given a sequence number as packets are written and the timestamp or sequence information of an erase block is used along with information gathered from container headers and packet headers to reconstruct the storage index. In another embodiment, timestamp or sequence information is written to an erase block when the erase block is recovered.

In a read, modify, write operation, data packets associated with the logical structure are located and read in a read operation. Data segments of the modified structure that have been modified are not written to the location from which they are read. Instead, the modified data segments are again converted to data packets and then written to the next available location in the virtual page currently being written. Index entries for the respective data packets are modified to point to the packets that contain the modified data segments. The entry or entries in the index for data packets associated with the same logical structure that have not been modified will include pointers to original location of the unmodified data packets. Thus, if the original logical structure is maintained, for example to maintain a previous version of the logical structure, the original logical structure will have pointers in the index to all data packets as originally written. The new logical structure will have pointers in the index to some of the original data packets and pointers to the modified data packets in the virtual page that is currently being written.

In a copy operation, the index includes an entry for the original logical structure mapped to a number of packets stored on the solid-state storage media 110. When a copy is made, a new logical structure is created and a new entry is created in the index mapping the new logical structure to the original packets. The new logical structure is also written to the solid-state storage media 110 with its location mapped to the new entry in the index. The new logical structure packets may be used to identify the packets within the original logical structure that are referenced in case changes have been made in the original logical structure that have not been propagated to the copy and the index is lost or corrupted. In another embodiment, the index includes a logical entry for a logical block.

Beneficially, sequentially writing packets facilitates a more even use of the solid-state storage media 110 and allows the solid-storage device controller 202 to monitor storage hot spots and level usage of the various virtual pages in the solid-state storage media 110. Sequentially writing packets also facilitates a powerful, efficient garbage collection system, which is described in detail below. One of skill in the art will recognize other benefits of sequential storage of data packets.

The system 100 may comprise a log-structured storage system or log-structured array similar to a log-structured file system and the order that data is stored may be used to recreate an index. Typically an index that includes a logical-to-physical mapping is stored in volatile memory. If the index is corrupted or lost, the index may be reconstructed by addressing the solid-state storage media 110 in the order that the data was written. Within a logical erase block ("LEB"), data is typically stored sequentially by filling a first logical page, then a second logical page, etc. until the LEB is filled. The solid-state storage controller 104 then chooses another LEB and the process repeats. By maintaining an order that the LEBs were written to and by knowing that each LEB is written sequentially, the index can be rebuilt by traversing the solid-state storage media 110 in order from beginning to end. In other embodiments, if part of the index is stored in non-volatile memory, such as on the solid-state storage media 110, the solid-state storage controller 104 may only need to replay a portion of the solid-state storage media 110 to rebuild a portion of the index that was not stored in non-volatile memory. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222*a-n*, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the host device 114 or may be other devices.

In one embodiment, the solid-state storage controller(s) 104 communicate data to the solid-state storage media 110 over a storage I/O bus 210. In a certain embodiment where the solid-state storage is arranged in banks 214 and each bank 214 includes multiple storage elements 216, 218, 220 accessible in parallel, the storage I/O bus 210 comprises an array of busses, one for each row of storage elements 216, 218, 220 spanning the banks 214. As used herein, the term "storage I/O bus" may refer to one storage I/O bus 210 or an array of data independent busses 204. In one embodiment, each storage I/O bus 210 accessing a row of storage elements (e.g. 216*a*, 218*a*, 220*a*) may include a logical-to-physical mapping for storage divisions (e.g. erase blocks) accessed in a row of storage elements 216*a*, 218*a*, 220*a*. This mapping allows a logical address mapped to a physical address of a storage division to be remapped to a different storage division if the first storage division fails, partially fails, is inaccessible, or has some other problem. Remapping is explained further in relation to the remapping module 430 of FIG. 4.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222*a-n* controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device 155 can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104*a*-104*n*-1 and associated solid-state storage media 110*a*-110*n*-1 while at least one channel (solid-state storage controller 104*n*, solid-state storage media 110*n*) is dedicated to in-band metadata, such as index information and other metadata generated internally to the cache 102.

The local bus 206 is typically a bidirectional bus or set of busses that allows for communication of data and commands between devices internal to the solid-state storage device controller 202 and between devices internal to the cache 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204 and bridges 238.

The system bus 240 is typically a bus of a host device 114 or other device in which the cache 102 is installed or connected. In one embodiment, the system bus 240 may be a PCI-e bus, a Serial Advanced Technology Attachment ("serial ATA") bus, parallel A TA, or the like. In another embodiment, the system bus 240 is an external bus such as small computer system interface ("SCSI"), Fire Wire, Fiber Channel, USB, PCIe-AS, or the like. The cache 102 may be packaged to fit internally to a device or as an externally connected device.

The solid-state storage device controller 202 includes a master controller 224 that controls higher-level functions within the cache 102. The master controller 224, in various embodiments, controls data flow by interpreting requests, directs creation of indexes to map identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. The master controller 224 may be embodied as hardware, as software, or as a combination of hardware and software. One skilled in the art will recognize many embodiments for the master controller 224.

In one embodiment, where the storage controller 152/solid-state storage device controller 202 manages multiple data storage devices/solid-state storage media 110a-n, the master controller 224 divides the work load among internal controllers, such as the solid-state storage controllers 104a-n. For example, the master controller 224 may divide a data structure to be written to the data storage devices (e.g. solid-state storage media 110a-n) so that a portion of the data structure is stored on each of the attached data storage devices. This feature is a performance enhancement allowing quicker storage and access to a data structure. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224 emulates block storage such that a host device 114 or other device connected to the storage device/cache 102 views the storage device/cache 102 as a block storage device and sends data to specific physical or logical addresses in the storage device/cache 102. The master controller 224 then divides up the blocks and stores the data blocks. The master controller 224 then maps the blocks and physical or logical address sent with the block to the actual locations determined by the master controller 224. The mapping is stored in the index. Typically, for block emulation, a block device application program interface ("API") is provided in a driver in the host device 114, or other device wishing to use the storage device/cache 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a host device 114 may have access to a computer network through an I/O memory driver using a standard stack API and operating in conjunction with NICs 244.

In one embodiment, the master controller 224 is also a redundant array of independent drive ("RAID") controller. Where the data storage device/cache 102 is networked with one or more other data storage devices, the master controller 224 may be a RAID controller for single tier RAID, multi-tier RAID, progressive RAID, etc. The master controller 224 may also allows some objects and other data structures to be stored in a RAID array and other data structures to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via a computer network) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/cache 102 may appear as a storage device connected through a SCSI bus, Internet SCSI ("iSCSI"), fiber channel, etc. Meanwhile the storage device/cache 102 may autonomously manage objects or other data structures and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/cache 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a cache 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc.

In other embodiments, the memory controller 228 controls two or more memory types and the memory controller 228 may include more than one controller. Typically, the memory controller 228 controls as much SRAM 232 as is feasible and by DRAM 230 to supplement the SR AM 232.

In one embodiment, the logical-to-physical index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/cache 102 and one or more external memory controllers 250 and associated external memory arrays 252 and CPUs 248. Note that the external memory controllers 250 and external memory arrays 252 are called external because they are external to the storage device/cache 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/cache 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/cache 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/cache 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
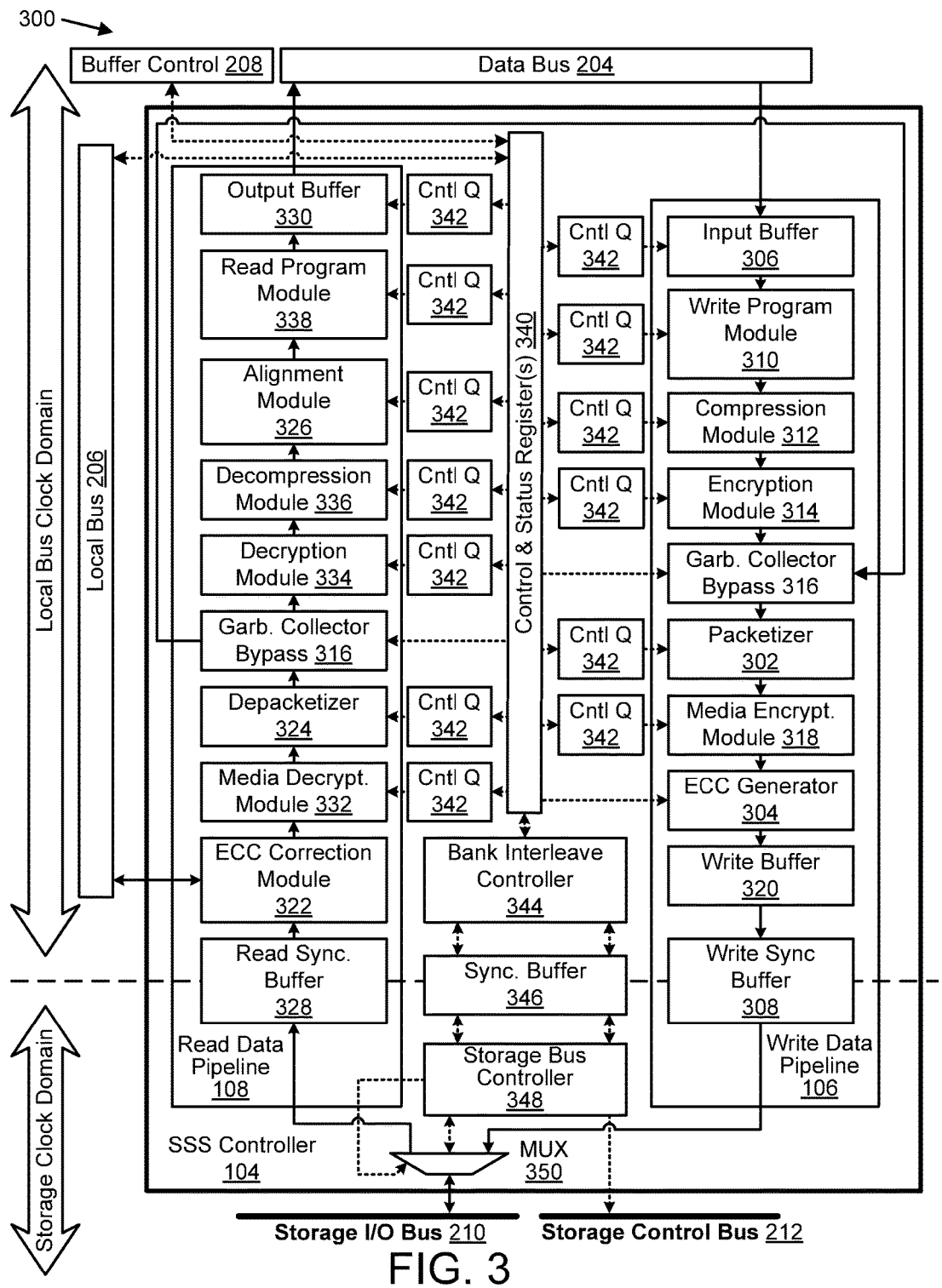
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a cache 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the host device 114, or other computer or device and is transmitted to the cache 102 in data segments streamed to the cache 102 and/or the host device 114. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicate the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the cache 102, the cache 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the cache 102, but outside the write data pipeline 106, in the host device 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synch buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the cache 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, cache 102, or server, the contents of the solid-state storage media 110 typically could not be read without use of the same encryption key used during the write of the data to the solid-state storage media 110 without significant effort.

In a typical embodiment, the cache 102 does not store the encryption key in non-volatile storage and allows no external access to the encryption key. The encryption key is provided to the solid-state storage controller 104 during initialization. The cache 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a host device 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the cache 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The cache 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a host device 114, a computer, key manager, or other device that holds the encryption key to be used to encrypt the data segment. In one embodiment, encryption keys are transferred to the solid-state storage controller 104 from one of a cache 102, a computer, a host device 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the cache 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the cache 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific cache 102 if the solid-state storage media 110 is connected to a different solid-state storage controller 104, cache 102, or host device 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the cache 102 is beneficial so that the host device 114 or other devices writing data to the cache 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the cache 102. This allows the cache 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by a host device 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a fill virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media. 110 to fill the pages of a virtual page prior to programming the data. In this way a data stall in the write data pipeline 106 would not stall reading from the cache 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the FCC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the cache 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the cache 102 prior to sending the one or more requested packets to the depacketizer 324. Typically the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a host device 114, a computer, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
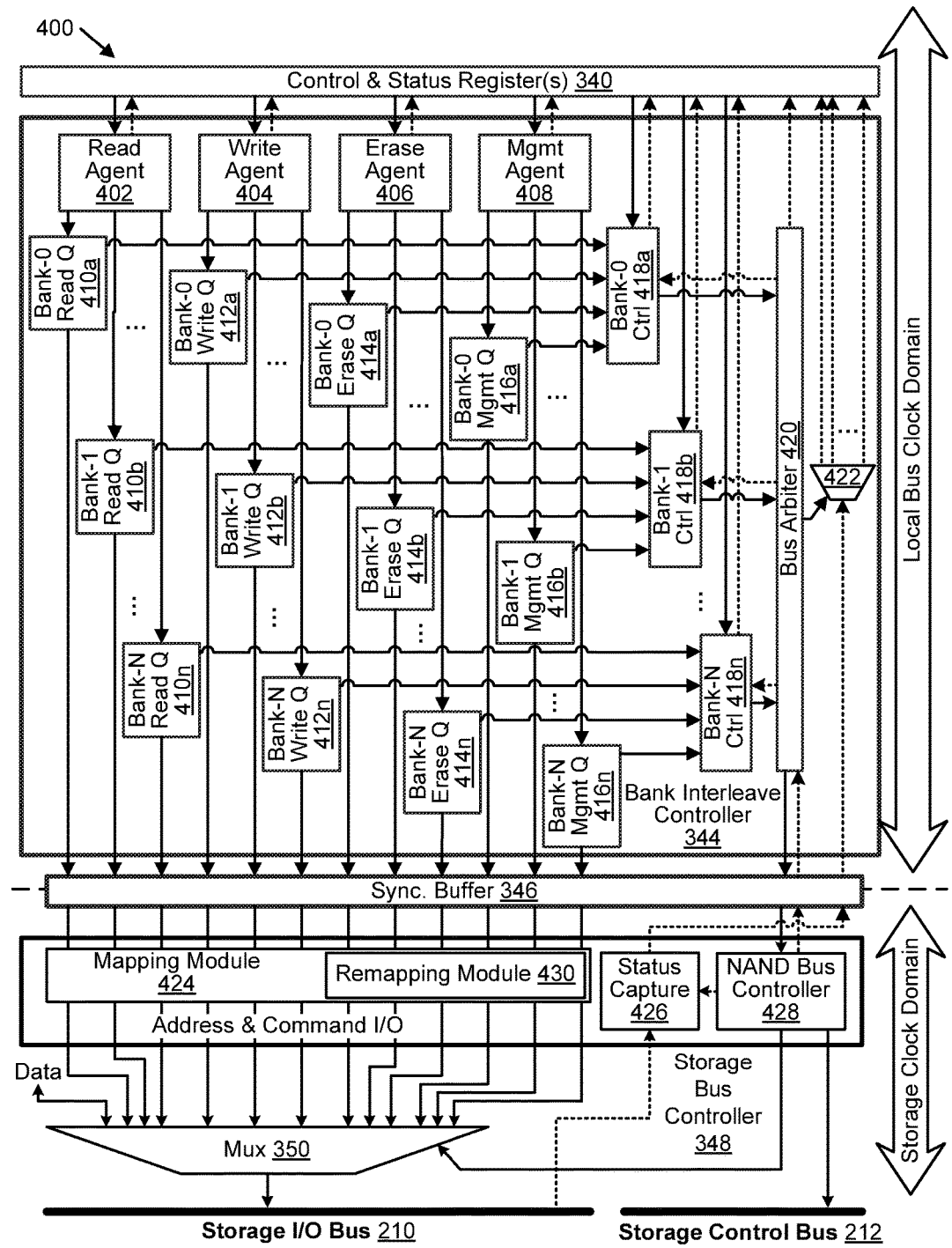
FIG. 4 is a schematic block diagram illustrating one embodiment of a bank interleave controller in the solid-state storage controller in accordance with the present invention.

The solid-state storage controller 104 and or the cache 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND) bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, N RAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410,412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate subcommands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank O 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write sub-command on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS M.0 216a, 216b, . . . 216m, a second bank interleave controller 344 serves a second column of storage elements SSS 0.1-SSS M.1 218a, 218b, . . . 218m etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the cache 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each row of solid-state storage elements (e.g. SSS 0.1 216a, SSS 0.2 218a, SSS O.N 220a). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each row of solid-state storage elements (SSS x.O to SSS x.N 216, 218, 220) to the MUX 350 for each row of solid-state storage elements (SSS x.O to SSS x.N 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g. SSS 0.0 to SSS M.0 216) per block 214a may have a logical address for a particular erase block mapped to twenty physical addresses of the erase block, one physical address per storage element. Because the storage elements are accessed in parallel, erase blocks at the same position in each storage element in a row of storage elements 216a, 218a, 220a will share a physical address. To select one erase block (e.g. in storage element SSS 0.0 216a) instead of all erase blocks in the row (e.g. in storage elements SSS 0.0, 0.1, . . . O.N 216a, 218a, 220a), one bank (in this case bank-0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 1.0 216b, . . . , and to storage element M.0 216m, virtual erase block 2 may be mapped to erase block 2 of storage element SSS 0.1 218a, to erase block 2 of storage element SSS 1.1 218b, . . . , and to storage element M.1 218m, etc. Alternatively, virtual erase block 1 may be mapped to one erase block from each storage element in an array such that virtual erase block 1 includes erase block 1 of storage element SSS 0.0 216a to erase block 1 of storage element SSS 1.0 216b to storage element M.0 216m, and erase block 1 of storage element SSS 0.1 218a to erase block 1 of storage element SSS 1.1 218b, . . . , and to storage element M.1 218m, for each storage element in the array up to erase block 1 of storage element M.N 220m.

If erase block 1 of a storage element SSS0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS O.0 216a is available and currently not mapped, the remapping module 430 could change the mapping of virtual erase block 1 to point to erase block 221 of storage element SSS 0.0 216a, while continuing to point to erase block 1 of storage element SSS 1.0 216b, erase block 1 of storage element SSS 2.0 (not shown) . . . , and to storage element M.0 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND) bus controller 428.

Data Caching

Figure 5:
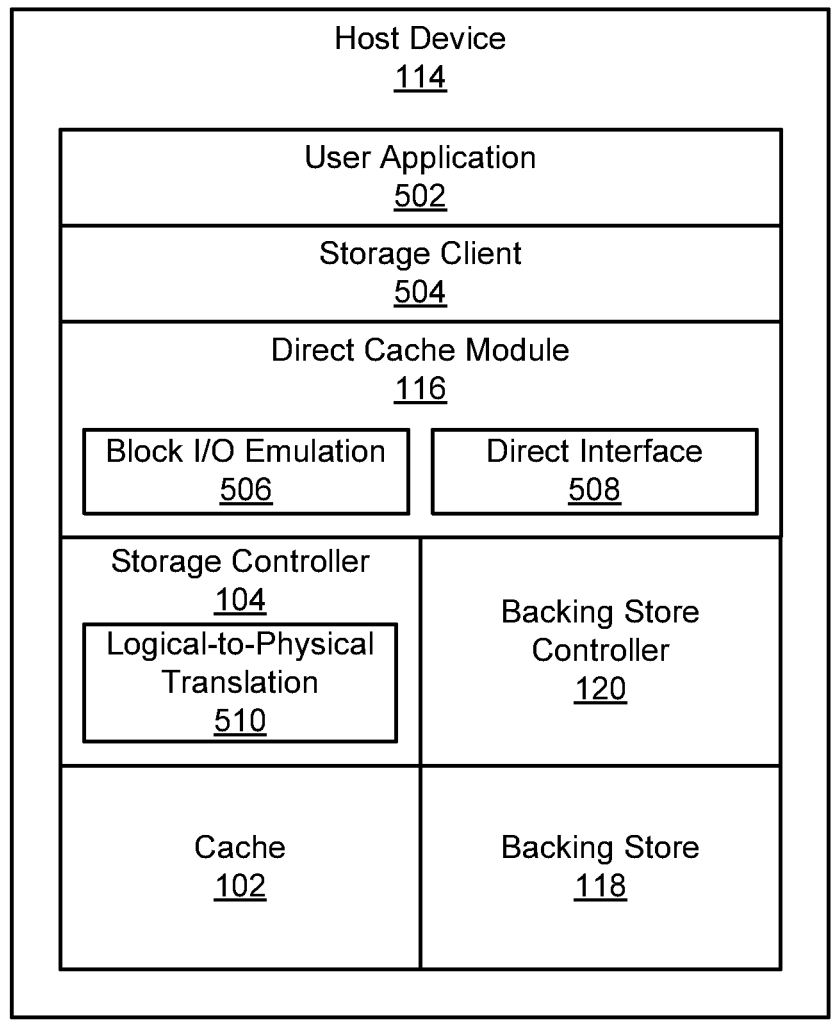
FIG. 5 is a schematic block diagram illustrating one embodiment of a host device in accordance with the present invention.

FIG. 5 depicts one embodiment of a host device 114. The host device 114 may be similar, in certain embodiments, to the host device 114 depicted in FIGS. 1A and 1B. The depicted embodiment includes a user application 502 in communication with a storage client 504. The storage client 504 is in communication with a direct cache module 116, which, in one embodiment, is substantially similar to the direct cache module 116 of FIGS. 1A and 1B, described above. The direct cache module 116, in the depicted embodiment, is in communication with the cache 102 and the backing store 118 through the storage controller 104 and the backing store controller 120.

In one embodiment, the user application 502 is a software application operating on or in conjunction with the storage client 504. The storage client 504 manages file systems, files, data, and the like and utilizes the functions and features of the direct cache module 116, the cache 102, and the backing store 118. Representative examples of storage clients include, but are not limited to, a server, a file system, an operating system, a database management system ("DBMS"), a volume manager, and the like.

In the depicted embodiment, the storage client 504 is in communication with the direct cache module 116. In a further embodiment, the storage client 504 may also be in communication with the cache 102 and/or the backing store 118 directly. The storage client 504, in one embodiment, reads data from and writes data to the backing store 118 through the direct cache module 116, which uses the cache 102 to cache read data and/or write data for the backing store 118. In a further embodiment, the direct cache module 116 caches data in a manner that is substantially transparent to the storage client 504, with the storage client 504 sending read requests and write requests directly to the direct cache module 116.

In one embodiment, the direct cache module 116 has exclusive access to and/or control over the cache 102 and the backing store 118. The direct cache module 116 may represent itself to the storage client 504 as a storage device. For example, the direct cache module 116 may represent itself as a conventional block storage device, or the like. In a particular embodiment, the direct cache module 116 may represent itself to the storage client 504 as a storage device having the same number of logical blocks (0 to N) as the backing store 118. In another embodiment, the direct cache module 116 may represent itself to the storage client 504 as a storage device have the more logical blocks (0 to N+X) as the backing store 118, where X=the number of logical blocks addressable by the direct cache module 116 beyond N. In certain embodiments, X=264-N.

As described above with regard to the direct cache module 116 depicted in the embodiments of FIGS. 1A and 1B, in various embodiments, the direct cache module 116 may be embodied by one or more of a storage controller 104 of the cache 102 and/or a backing store controller 120 of the backing store 118; a separate hardware controller device that interfaces with the cache 102 and the backing store 118; a device driver loaded on the host device 114; and the like.

In one embodiment, the host device 114 loads a device driver for the direct cache module 116. In a further embodiment, the host device 114 loads device drivers for the cache 102 and/or the backing store 118, such as one or more device drivers of the storage controller 104 and/or the backing store controller 120. The direct cache module 116 may communicate with the cache 102 and/or the backing store 118 through device drivers loaded on the host device 114, through the storage controller 104 of the cache 102 and/or through the backing store controller 120 of the backing store 118, or the like.

In one embodiment, the storage client 504 communicates with the direct cache module 116 through an Input/Output ("I/O") interface represented by a block I/O emulation layer 506. In certain embodiments, the fact that the direct cache module 116 is providing caching services in front of one or more caches 102, and/or one or more backing stores, such as the backing store 118, may be transparent to the storage client 504. In such an embodiment, the direct cache module 116 may present (i.e., identify itself as) a conventional block device to the storage client 504.

In a further embodiment, the cache 102 and/or the backing store 118 either include a distinct block I/O emulation layer 506 or may be conventional block storage devices. Certain conventional block storage devices divide the storage media into volumes or partitions. Each volume or partition may include a plurality of sectors. One or more sectors are organized into a logical block. In certain storage systems, such as those interfacing with the Windows-® operating systems, the logical blocks are referred to as clusters. In other storage systems, such as those interfacing with UNIX, Linux, or similar operating systems, the logical blocks are referred to simply as blocks. A logical block or cluster represents a smallest physical amount of storage space on the storage media that is addressable by the storage client 504. A block storage device may associate n logical blocks available for user data storage across the storage media with a logical block address, numbered from 0 to n. In certain block storage devices, the logical block addresses may range from 0 to r per volume or partition. In conventional block storage devices, a logical block address maps directly to a particular logical block. In conventional block storage devices, each logical block maps to a particular set of physical sectors on the storage media.

However, the direct cache module 116, the cache 102 and/or the backing store 118, in certain embodiments, may not directly or necessarily associate logical block addresses with particular physical blocks. The direct cache module 116, the cache 102, and/or the backing store 118 may emulate a conventional block storage interface to maintain compatibility with block storage clients 504 and with conventional block storage commands and protocols.

When the storage client 504 communicates through the block I/O emulation layer 506, the direct cache module 116 appears to the storage client 504 as a conventional block storage device. In one embodiment, the direct cache module 116 provides the block I/O emulation layer 506 which serves as a block device interface, or API In this embodiment, the storage client 504 communicates with the direct cache module 116 through this block device interface. In one embodiment, the block I/O emulation layer 506 receives commands and logical block addresses from the storage client 504 in accordance with this block device interface. As a result, the block I/O emulation layer 506 provides the direct cache module 116 compatibility with block storage clients 504. In a further embodiment, the direct cache module 116 may communicate with the cache 102 and/or the backing store 118 using corresponding block device interfaces.

In one embodiment, a storage client 504 communicates with the direct cache module 116 through a direct interface layer 508. In this embodiment, the direct cache module 116 directly exchanges information specific to the cache 102 and/or the backing store 118 with the storage client 504. Similarly, the direct cache module 116, in one embodiment, may communicate with the cache 102 and/or the backing store 118 through direct interface layers 508.

A direct cache module 116 using the direct interface 508 may store data on the cache 102 and/or the backing store 118 as blocks, sectors, pages, logical blocks, logical pages, erase blocks, logical erase blocks, ECC chunks or in any other format or structure advantageous to the technical characteristics of the cache 102 and/or the backing store 118. For example, in one embodiment, the backing store 118 comprises a hard disk drive and the direct cache module 116 stores data on the backing store 118 as contiguous sectors of 512 bytes, or the like, using physical cylinder-head-sector addresses for each sector, logical block addresses for each sector, or the like. The direct cache module 116 may receive a logical address and a command from the storage client 504 and perform the corresponding operation in relation to the cache 102, and/or the backing store 118. The direct cache module 116, the cache 102, and/or the backing store 118 may support a block I/O emulation layer 506, a direct interface 508, or both a block I/O emulation layer 506 and a direct interface 508.

As described above, certain storage devices, while appearing to a storage client 504 to be a block storage device, do not directly associate particular logical block addresses with particular physical blocks, also referred to in the art as sectors. Such storage devices may use a logical-to-physical translation layer 510. In the depicted embodiment, the cache 102 includes a logical-to-physical translation layer 510. In a further embodiment, the backing store 118 may also include a logical-to-physical translation layer 510. In another embodiment, the direct cache module 116 maintains a single logical-to-physical translation layer 510 for the cache 102 and the backing store 118. In another embodiment, the direct cache module 116 maintains a distinct logical-to-physical translation layer 510 for each of the cache 102 and the backing store 118.

The logical-to-physical translation layer 510 provides a level of abstraction between the logical block addresses used by the storage client 504 and the physical block addresses at which the cache 102 and/or the backing store 118 store the data. In the depicted embodiment, the logical-to-physical translation layer 510 maps logical block addresses to physical block addresses of data stored on the media of the cache 102. This mapping allows data to be referenced in a logical address space using logical identifiers, such as a logical block address. A logical identifier does not indicate the physical location of data in the cache 102, but is an abstract reference to the data. The mapping module 424 and the remapping module 430 of FIG. 4, discussed above, are one example of a logical-to-physical translation layer 510. One further example of a logical-to-physical translation layer 510 includes the direct mapping module 706 of FIG. 7 discussed below.

In the depicted embodiment, the cache 102 and the backing store 118 separately manage physical block addresses in the distinct, separate physical address spaces of the cache 102 and the backing store 118. In one example, contiguous logical block addresses may in fact be stored in non-contiguous physical block addresses as the logical-to-physical translation layer 510 determines the location on the physical media 110 of the cache 102 at which to perform data operations.

Furthermore, in one embodiment, the logical address space of the cache 102 is substantially larger than the physical address space or storage capacity of the cache 102. This "thinly provisioned" or "sparse address space" embodiment, allows the number of logical addresses for data references to greatly exceed the number of possible physical addresses. A thinly provisioned and/or sparse address space also allows the cache 102 to cache data for a backing store 118 with a larger address space (i.e., a larger storage capacity) than the physical address space of the cache 102.

In one embodiment, the logical-to-physical translation layer 510 includes a map or index that maps logical block addresses to physical block addresses. The map or index may be in the form of a B-tree, a content addressable memory ("CAM"), a binary tree, and/or a hash table, and the like. In certain embodiments, the logical-to-physical translation layer 510 is a tree with nodes that represent logical block addresses and include references to corresponding physical block addresses. Example embodiments of B-tree mapping structure are described below with regard to FIGS. 8, 9, and 10. In certain embodiments, the direct cache module 116 uses a mapping structure of the logical-to-physical translation layer 510 to locate ranges of data to destage in backing store address order. The direct cache module 116, in one embodiment, requests data for destaging, in cache log order, backing store address order, or the like, from the storage controller 104 and the storage controller 104 returns the data (or references to the data) to the direct cache module 116 for destaging.

As stated above, in conventional block storage devices, a logical block address maps directly to a particular physical block. When a storage client 504 communicating with the conventional block storage device deletes data for a particular logical block address, the storage client 504 may note that the particular logical block address is deleted and can re-use the physical block associated with that deleted logical block address without the need to perform any other action.

Conversely, when a storage client 504, communicating with a storage controller 104 or device driver with a logical-to-physical translation layer 510 (a storage controller 104 or device driver that does not map a logical block address directly to a particular physical block), deletes data of a logical block address, the corresponding physical block address may remain allocated because the storage client 504 may not communicate the change in used blocks to the storage controller 104 or device driver. The storage client 504 may not be configured to communicate changes in used blocks (also referred to herein as "data block usage information"). Because the storage client 504, in one embodiment, uses the block I/O emulation 506 layer, the storage client 504 may erroneously believe that the direct cache module 116, the cache 102, and/or the backing store 118 is a conventional block storage device that would not utilize the data block usage information. Or, in certain embodiments, other software layers between the storage client 504 and the direct cache module 116, the cache 102, and/or the backing store 118 may fail to pass on data block usage information.

Consequently, the storage controller 104 or device driver may preserve the relationship between the logical block address and a physical address and the data on the cache 102 and/or the backing store 118 corresponding to the physical block. As the number of allocated blocks increases, the performance of the cache 102 and/or the backing store 118 may suffer depending on the configuration of the cache 102 and/or the backing store 118.

Specifically, in certain embodiments, the cache 102, and/or the backing store 118 are configured to store data sequentially, using an append-only writing process, and use a storage space recovery process that re-uses non-volatile storage media storing deallocated/unused logical blocks. Specifically, as described above, the cache 102, and/or the backing store 118 may sequentially write data on the solid-state storage media 110 in a log structured format and within one or more physical structures of the storage elements, the data is sequentially stored on the solid-state storage media 110. Those of skill in the art will recognize that other embodiments that include several caches 102 can use the same append-only writing process and storage space recovery process.

As a result of storing data sequentially and using an append-only writing process, the cache 102 and/or the backing store 118 achieve a high write throughput and a high number of I/O operations per second ("IOPS"). The cache 102 and/or the backing store 118 may include a storage space recovery, or garbage collection process that re-uses data storage cells to provide sufficient storage capacity. The storage space recovery process reuses storage cells for logical blocks marked as deallocated, invalid, unused, or otherwise designated as available for storage space recovery in the logical-physical translation layer 510. In one embodiment, the direct cache module 116 marks logical blocks as deallocated or invalid based on a cache eviction policy, to recover storage capacity for caching additional data for the backing store 118. The direct cache module 116, in certain embodiments, selects data that is either cached read data or destaged, cleaned write data to clear, invalidate, or evict. The storage space recovery process is described in greater detail below with regard to the garbage collection module 714 of FIG. 7.

As described above, the storage space recovery process determines that a particular section of storage may be recovered. Once a section of storage has been marked for recovery, the cache 102 and/or the backing store 118 may relocate valid blocks (e.g. packets, pages, sectors, etc.) in the section. The storage space recovery process, when relocating valid blocks, copies the packets and writes them to another location so that the particular section of storage may be reused as available storage space, typically after an erase operation on the particular section. The cache 102 and/or the backing store 118 may then use the available storage space to continue sequentially writing data in an append-only fashion. Consequently, the storage controller 104 expends resources and overhead in preserving data in valid blocks. Therefore, physical blocks corresponding to deleted logical blocks may be unnecessarily preserved by the storage controller 104, which expends unnecessary resources in relocating the physical blocks during storage space recovery.

The direct cache module 116, in certain embodiments, decreases write amplification caused by relocating and copying data forward by destaging data in a cache log order and clearing, invalidating, or evicting certain clean, destaged data instead of copying the data forward. In a further embodiment, the direct cache module 116 balances destaging of data in cache log order with destaging of data in backing store address order to satisfy a destaging pressure or target destaging rate while managing write amplification.

Some storage devices are configured to receive messages or commands notifying the storage device of these unused logical blocks so that the storage device may deallocate the corresponding physical blocks (e.g. the physical storage media 110 storing the unused packets, pages, sectors, etc.). As used herein, to deallocate a physical block includes marking the physical block as invalid, unused, or otherwise designating the physical block as available for storage space recovery, its contents on storage media no longer needing to be preserved by the storage device. Data block usage information may also refer to information maintained by a storage device regarding which physical blocks are allocated and/or deal located/unallocated and changes in the allocation of physical blocks and/or logical-to-physical block mapping information. Data block usage information may also refer to information maintained by a storage device regarding which blocks are in use and which blocks are not in use by a storage client 504. Use of a block may include storing of data in the block on behalf of the storage client 504, reserving the block for use by the storage client 504, and the like.

While physical blocks may be deallocated, in certain embodiments, the cache 102 and/or the backing store 118 may not immediately erase the data on the storage media. An erase operation may be performed later in time. In certain embodiments, the data in a deallocated physical block may be marked as unavailable by the cache 102 and/or the backing store 118 such that subsequent requests for data in the physical block return a null result or an empty set of data. In certain embodiments, the direct cache module 116 evicts and/or invalidates data by deallocating physical blocks corresponding to the data in the cache 102.

One example of a command or message for such deallocation is the "TRIM" function is described in greater detail in U.S. patent application Ser. No. 12/711,113 entitled "APPARATUS, SYSTEM, AND METHOD FOR DATA BLOCK USAGE INFORMATION SYNCHRONIZATION FOR A NON-VOLATILE STORAGE VOLUME" and filed on Feb. 23, 2010 and in U.S. patent application Ser. No. 11/952,113 entitled "APPARATUS, SYSTEM, AND METHOD FOR MANAGING DATA IN A STORAGE DEVICE WITH AN EMPTY DATA TOKEN DIRECTIVE" and filed on Dec. 6, 2007, which are incorporated herein by reference. A storage device, upon receiving a TRIM command, may deallocate physical blocks for logical blocks whose data is no longer needed by the storage client 504. A storage device that deallocates physical blocks may achieve better performance and increased storage space, especially storage devices that write data using certain processes and/or use a similar data storage recovery process as that described above.

Consequently, the performance of the storage device is enhanced as physical blocks are deallocated when they are no longer needed such as through the TRIM command or other similar deallocation commands issued to the cache 102 and/or the backing store 118. In one embodiment, the direct cache module 116 clears, trims, and/or evicts cached data from the cache 102 based on a cache eviction policy, or the like. As used herein, clearing, trimming, or evicting data includes deallocating physical media associated with the data, marking the data as invalid or unused (using either a logical or physical address of the data), erasing physical media associated with the data, overwriting the data with different data, issuing a TRIM command or other deallocation command relative to the data, or otherwise recovering storage capacity of physical storage media corresponding to the data. Cleating cached data from the cache 102 based on a cache eviction policy frees storage capacity in the cache 102 to cache more data for the backing store 118.

The direct cache module 116, in various embodiments, may represent itself, the cache 102, and the backing store 118 to the storage client 504 in different configurations. In one embodiment, the direct cache module 116 may represent itself to the storage client 504 as a single storage device (e.g., as the backing store 118, as a storage device with a similar physical capacity as the backing store 118, or the like) and the cache 102 may be transparent or invisible to the storage client 504. In another embodiment, the direct cache module 116 may represent itself to the direct cache module 116 as a cache device (e.g., as the cache 102, as a cache device with certain cache functions or APIs available, or the like) and the backing store 118 may be separately visible and/or available to the storage client 504 (with part of the physical capacity of the backing store 118 reserved for the cache 201). In a further embodiment, the direct cache module 116 may represent itself to the storage client 504 as a hybrid cache/storage device including both the cache 102 and the backing store 118.

Depending on the configuration, the direct cache module 116 may pass certain commands down to the cache 102 and/or to the backing store 118 and may not pass down other commands. In a further embodiment, the direct cache module 116 may support certain custom or new block I/O commands. In one embodiment, the direct cache module 116 supports a deallocation or trim command that clears corresponding data from both the cache 102 and the backing store 118, i.e., the direct cache module 116 passes the command to both the cache 102 and the backing store 118. In a further embodiment, the direct cache module 116 supports a flush type trim or deallocation command that ensures that corresponding data is stored in the backing store 118 (i.e., that the corresponding data in the cache 102 is clean) and clears the corresponding data from the cache 102, without clearing the corresponding data from the backing store 118. In another embodiment, the direct cache module 116 supports an evict type trim or deallocation command that evicts corresponding data from the cache 102, marks corresponding data for eviction in the cache 102, or the like, without clearing the corresponding data from the backing store 118.

In a further embodiment, the direct cache module 116 may receive, detect, and/or intercept one or more predefined commands that a storage client 504 or another storage manager sent to the backing store 118, that a storage manager sends to a storage client 504, or the like. For example, in various embodiments, the direct cache module 116 or a portion of the direct cache module 116 may be part of a filter driver that receives or detects the predefined commands, the direct cache module 116 may register with an event server to receive a notification of the predefined commands, or the like. The direct cache module 116, in one embodiment, performs one or more actions on the cache 102 in response to detecting the one or more predefined commands for the backing store 118, such as writing or flushing data related to a command from the cache 102 to the backing store 118, evicting data related to a command from the cache 102, switching from a write back policy to a write through policy for data related to a command, or the like.

One example of predefined commands that the direct cache module 116 may intercept or respond to, in one embodiment, includes a "freeze/thaw" commands. "Freeze/thaw" commands are used in SANs, storage arrays, and the like, to suspend storage access, such as access to the backing store 118 or the like, to take an snapshot or backup of the storage without interrupting operation of the applications using the storage. "Freeze/thaw" commands alert a storage client 504 that a snapshot is about to take place, the storage client 504 flushes pending operations, for example in-flight transactions, or data cached in volatile memory, the snapshot takes place while the storage client 504 use of the storage is in a "frozen" or ready state, and once the snapshot is complete the storage client 504 continues normal use of the storage in response to a thaw command.

The direct cache module 116, in one embodiment, flushes or cleans dirty data from the cache 102 to the backing store 118 in response to detecting a "freeze/thaw" command. In a further embodiment, the direct cache module 116 suspends access to the backing store 118 during a snapshot or other backup of a detected "freeze/thaw" command and resumes access in response to a completion of the snapshot or other backup. In another embodiment, the direct cache module 116 may cache data for the backing store 118 during a snapshot or other backup without interrupting the snapshot or other backup procedure. In other words, rather than the backup/snapshot software signaling the application to quiesce I/O operations, the direct cache module 116 receives and responds to the freeze/thaw commands.

Figure 6:
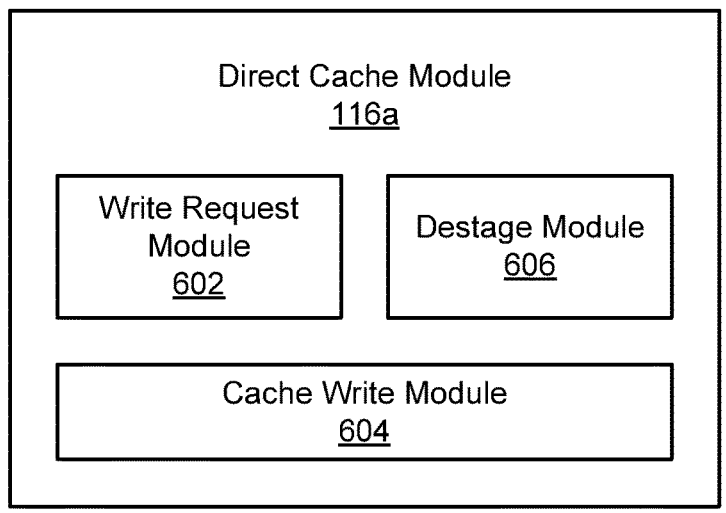
FIG. 6 is a schematic block diagram illustrating one embodiment of a direct cache module in accordance with the present invention.

FIG. 6 depicts one embodiment of the direct cache module 116a. In the depicted embodiment, the direct cache module 116a includes a write request module 602, a cache write module 604, and a destage module 606. The direct cache module 116a of FIG.

6, in one embodiment, is substantially similar to the direct cache module 116 described above with regard to FIG. 1A, FIG. 1B and/or FIG. 5. In general, the direct cache module 116a caches data for the backing store 118 and destages cached write data to the backing store 118 in cache log order and/or in backing store address order.

In one embodiment, the write request module 602 detects one or more write requests to store data on the backing store 118. The write request module 602 may detect a write request by receiving the write request directly, detecting a write request sent to a different module or entity (such as detecting a write request sent directly to the backing store 118), or the like. In one embodiment, the host device 114 sends the write request. The direct cache module 116a, in one embodiment, represents itself to the host device 114 as a storage device, and the host device 114 sends write requests directly to the write request module 602.

A write request, in one embodiment, includes data that is not stored on the backing store 118. Data that is not stored on the backing store 118, in various embodiments, includes new data not yet stored on the backing store 118, modifications to data that is stored on the backing store 118, and the like. The write request, in various embodiments, may directly include the data, may include a reference, a pointer, or an address for the data, or the like. For example, in one embodiment, the write request includes a range of addresses indicating data to be stored on the backing store 118 by way of a Direct Memory Access ("DMA") or Remote DMA ("RDMA") operation. In a further embodiment, a single write request may include several different contiguous and/or noncontiguous ranges of addresses or blocks. In a further embodiment, the write request includes one or more destination addresses for the data, such as logical and/or physical addresses for the data on the cache 102 and/or on the backing store 118. The write request module 602 and/or another cooperating module, in various embodiments, may retrieve the data of a write request directly from the write request itself, from a storage location referenced by a write request (i.e., from a location in system memory or other data storage referenced in a DMA or RDMA request), or the like.

The cache write module 604, in one embodiment, writes data of a write request to the cache 102 to cache the data in the cache 102. The cache write module 604, in another embodiment, caches the data of the write request to the cache 102 at one or more logical addresses of the cache 102 corresponding to one or more backing store addresses of the write request. In one embodiment, the cache write module 604 caches the data to the cache 102 by appending the data to a sequential, log-based writing structure preserved in the physical storage media 110 of the cache 102 at an append point. The cache write module 604, in one embodiment, returns one or more physical addresses corresponding to a location of the append point at which the data was appended to a direct mapping module such as the direct mapping module 706 described below with regard to FIG. 7, which maps the one or more logical addresses of the cache 102 to the one or more physical addresses corresponding to the append point.

The destage module 606, in one embodiment, destages cached data from the cache 102 to the backing store 118. The destage module 606 destages data to the backing store 118 by copying, writing, storing, or otherwise persisting the data in the backing store 118. The destage module 606 destages dirty write data that the backing store 118 does not yet store. Data that is stored in the cache 102 that is not yet stored in the backing store 118 is referred to as "dirty" data. Once the backing store 118 stores data, the data is referred to as "clean." The destage module 606 destages or cleans data in the cache 102 by writing the data to the backing store 118. In certain embodiments, the destage module 606 may also destage some clean data that the backing store 118 already stores, such as clean data that is within a range of dirty data, an entire region or block of data to obviate the need for tracking clean and dirty data within the region, or the like.

In one embodiment, the destage module 606 destages data from the cache 102 to the backing store 118 in a cache log order. As described above with regard to the cache 102 of FIGS. 1A and 1B, the cache log order is an order in which data is organized within or appended to a log of the cache 102, such as oldest to newest or the like. In a further embodiment, the destage module 606 destages data from the cache 102 to the backing store 118 in a sequential backing store address order. As described above with regard to the cache 102 of FIGS. 1A and 1B, the sequential backing store address order, in certain embodiments, comprises one or more ranges of address contiguous data that is sequentially ordered by backing store address.

In one embodiment, the destage module 606 traverses a log of the cache 102 to select data to destage in cache log order. The destage module 606, in certain embodiments, destages data in cache log order region by region. A region may include an erase block such as an LEB, a page, a block, a sector, a packet, or another discrete segment of data. The destage module 606, in one embodiment, traverses the log from one region to a neighboring region. In various embodiments, regions in a log may be physical neighbors in the storage media 110, logical neighbors in a data structure of the log, or the like. For example, the destage module 606, in one embodiment, may follow logical pointers or references from region to neighboring region in cache log order to destage data. As discussed below with regard to the re-order module 726 of FIG. 7, in one embodiment, the destage module 606 may re-order data within a region for destaging. For example, the destage module 606 may destage regions in cache log order, but may re-order data within the region by backing store address order.

In one embodiment, the destage module 606 traverses a mapping structure or cache index that maps backing store addresses to locations on physical storage media of the cache 102 to select ranges of data to destage in backing store address order. The destage module 606, in one embodiment, may traverse the mapping structure in backing store address order and destage ranges of data in backing store address order. In another embodiment, the destage module 606 may traverse the mapping structure in a different order, such as by level in a tree, by frequency of access in order to destage the least accessed or "coldest" data first, or in another order. For example, in certain embodiments, the destage module 606 may access the mapping structure in an order that is based on access statistics for the mapping structure, or the like.

In one embodiment, the destage module 606 selects a destage data range of data for destaging in a backing store address order such that members of the data range have contiguous and sequential backing store addresses. In a further embodiment, the destage module 606 selects destage data ranges based on a predefined sequential threshold, selecting destage data ranges that have at least the predefined sequential threshold amount of contiguous and sequential backing store addresses for destaging.

As discussed in greater detail below with regard to the dirty indicator module 712 of FIG. 7, in certain embodiments, the destage module 606 accesses one or more dirty data indicators to determine which data in the cache 102 is dirty and a candidate for destaging. In one embodiment, the destage module 606 destages in a cache log order, and the dirty data indicator includes a pointer indicating a current destage point, and user write data to one side of the pointer is clean while user write data to the other side of the pointer is dirty. One example of a pointer indicating a current destage point is described below with regard to FIG. 10. In other embodiments, a dirty data indicator may include one or more flags, one or more bit fields, one or more bit arrays, or the like.

Dirty data indicators, in various embodiments, may be stored in a mapping structure, in a reverse map, in volatile memory of the cache 102 or the host device 114, in a region of data such as an erase block or a packet, and/or in other data storage accessible to the destage module 606. In a further embodiment, the destage module 606 may store dirty indicators on volatile memory and may also store at least enough information to reconstruct the dirty indicators in the storage media 110 of the cache 102. In one embodiment, the destage module 606 updates one or more dirty data indicators in response to successfully destaging data to the backing store 118 so that the one or more dirty data indicators indicate that the destaged data is clean.

The destage module 606, in one embodiment, may determine an address for selected destage data in the backing store 118 based on a write request corresponding to the data. In a further embodiment, the destage module 606 determines an address for destage data in the backing store 118 based on a logical address of the data in the cache 102, based on a cache index, a mapping structure, or the like. In another embodiment, the destage module 606 uses a reverse map or the like to determine an address for destage data in the backing store 118 based on a physical address of the data in the cache 102.

The destage module 606, in one embodiment, writes data to the backing store 118 based on a write policy. In one embodiment, the destage module 606 uses a write-back write policy, and does not immediately write data of a write request to the backing store 118 upon detecting the write request. Instead, the destage module 606, in one embodiment, performs an opportunistic or "lazy" write, destaging data to the backing store 118 when the data is evicted from the cache 102, when the cache 102 and/or the direct cache module 116 has a light load, when available storage capacity in the cache 102 falls below a threshold, to satisfy a destaging pressure or target destage rate, or the like. In certain write-back embodiments, the destage module 606 may read data from the cache 102 and write the data to the backing store 118.

In another embodiment, instead of cleaning data according to a write-back write policy, the destage module 606 uses a write-through policy, performing a synchronous write to the backing store 118 for each write request that the write request module 602 receives. The destage module 606, in one embodiment, transitions from a write-back to a write-through write policy in response to a predefined error condition, such as an error or failure of the cache 102, or the like.

In one embodiment, the destage module 606 does not invalidate or evict destaged data from the cache 102, but destaged data remains in the cache 102 to service read requests until the destaged data is evicted from the cache by a separate eviction process. In a further embodiment, the destage module 606 may invalidate, clear, or evict destaged data from the cache 102 once the backing store 118 stores the data. In certain embodiments, evicting data upon destaging may lead to an increase in cache misses, but may also increase a speed or efficiency of garbage collection/grooming of the cache 102.

In one embodiment, described in greater detail below with regard to FIG. 7, the destage module 606 destages a portion of dirty data in cache log order and a portion of dirty data in backing store address order. The destage module 606, in a further embodiment, adjusts a ratio, duty cycle, or the like of destaging in cache log order and in backing store address order to satisfy a destaging pressure, a destaging target, or the like.

Figure 7:
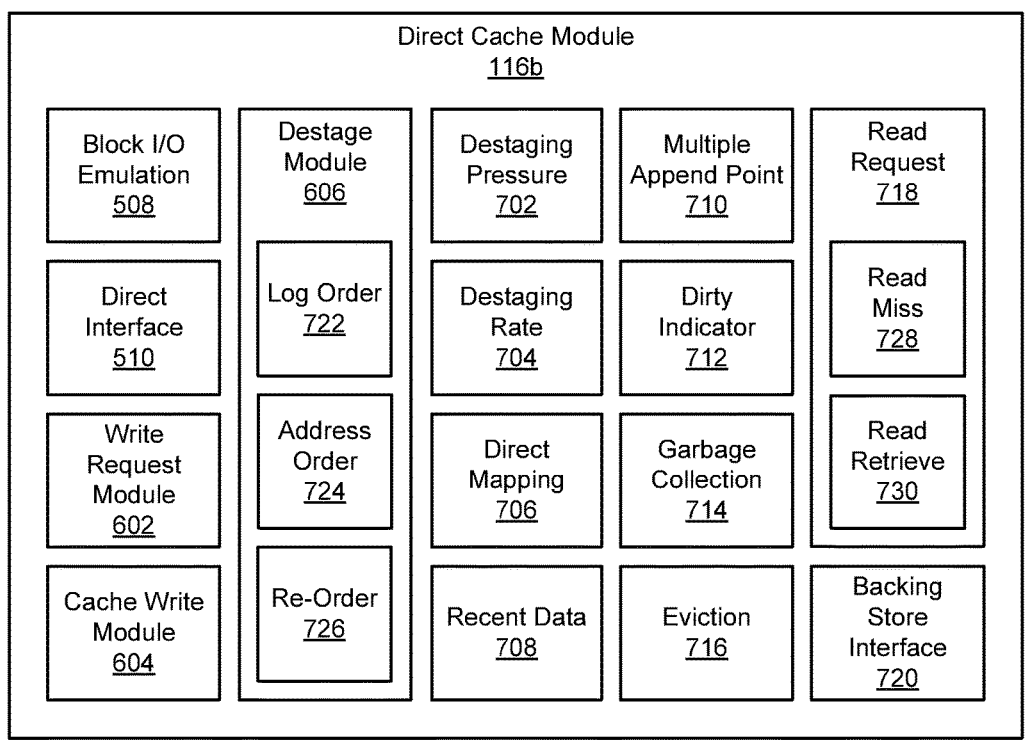
FIG. 7 is a schematic block diagram illustrating another embodiment of a direct cache module in accordance with the present invention.

FIG. 7 depicts another embodiment of the direct cache module 116b. In the depicted embodiment, the direct cache module 116b includes the block I/O emulation layer 508, the direct interface layer 510, the write request module 602, the cache write module 604, and the destage module 606, substantially as described above with regard to FIGS. 5 and 6. The direct cache module 116b, in the depicted embodiment, further includes a destaging pressure module 702, a destaging rate module 704, a direct mapping module 706, a recent data module 708, a multiple append point module 710, a dirty indicator module 712, a garbage collection module 714, an eviction module 716, a read request module 718, and a backing store interface module 720. The direct cache module 116b, in certain embodiments, may be substantially similar to the direct cache module 116 of FIGS. 1A and 1B, the direct cache module 116 of FIG. 5, and the direct cache module 116b of FIG. 6.

In the depicted embodiment, the destage module 606 includes a log order module 722, an address order module 724, and a re-order module 726. In one embodiment, the log order module 722 destages at least a portion of dirty data from the cache 102 to the backing store 118 in a cache log order and the address order module 724 destages at least a portion of dirty data from the cache 102 to the backing store 118 in a backing store address order.

In a cache log order, the backing store addresses of the data may be somewhat random or unorganized due to an order in which the host device 114, a user application 502, a storage client 504, or the like writes the data. As described above with regard to FIGS. 1A and 1B, in certain embodiments, the backing store 118 may have a lower write rate when destaging in cache log order than when destaging in backing store address order, due to write head seek times, or the like. Destaging in cache log order, however, in certain embodiments, may be more efficient for the cache 102. For example, older data on the log may be more likely to be groomed by the garbage collection module 714 and destaging the data prior to grooming may reduce write amplification because destaged data may be selectively evicted from the cache 102 instead of written forward on the log.

To take advantage of these different efficiencies, in certain embodiments, the destage module 606 manages a ratio, duty cycle, or the like of destaging in cache log order using the log order module 722 and destaging in backing store address order using the address order module 724. As described below with regard to the destaging pressure module 702 and the destaging rate module 704, in one embodiment, the destage module 606 uses the log order module 722 and/or the address order module 724 to destage data at a destaging rate that satisfies a destaging pressure for the cache 102.

In one embodiment, the log order module 722 destages dirty data region by region with the regions ordered in cache log order. In a further embodiment, the regions are the same size, granularity, or type of region groomed by the garbage collection module 714, such as erase blocks (e.g. LEBs, PEBs, etc.), pages, packets, or the like. Destaging data at the same size granularity as the units the garbage collection module 714 uses to groom the data, in certain embodiments, may be more efficient for the grooming process. In certain embodiments, reasons for this improved efficiency are because the log order module 722 destages dirty data for an entire region, write amplification may be decreased, and the like. In another embodiment, the log order module 722 may destage regions of a different size, granularity, or type than the garbage collection module 714 grooms.

In one embodiment, once the log order module 722 selects a region for destaging in cache log order, the re-order module 726 re-orders data stored in the selected region to a backing store address order. Re-ordering (or pre-ordering) data of a region for destaging, in certain embodiments, may increase the write rate of the backing store 118 when destaging the region, even if the log order module 722 destages the regions themselves in cache log order. The re-order module 726, in one embodiment, sends the data of a region to a buffer, a queue, or the like in backing store address order for destaging to the backing store 118.

As described above, in one embodiment, the type of region is selected based on a size, granularity, or type of region that the garbage collection module 714 grooms. In another embodiment, the re-order module 726 re-orders a region of a different size, granularity, or type than the garbage collection module 714 grooms. For example, in one embodiment, the log order module 722 may select a region of the log to destage, such as a quarter, a half or another portion of the log, and the re-order module 726 may re-order dirty data for the selected region. The re-order module 726, in various embodiments, may re-order data of a region by packet, by sector, by block, by page, or the like.

In one embodiment, the destaging pressure module 702 determines a destaging pressure for the cache 102. The destaging pressure, in one embodiment, is a level of demand for destaging cached data of the cache 102. The destaging pressure module 702, in a further embodiment, determines a destaging pressure based on a difference between an actual amount of dirty write data in the cache 102 and a target amount of dirty write data in the cache 102. For example, the destaging pressure module 702 may use a predefined destaging pressure scale with a higher destaging pressure as the actual amount of dirty write data approaches, exceeds, or has another predefined relationship with the target amount of dirty write data. Destaging pressure comprises a level of importance or priority for performing destaging operations.

The target amount of dirty write data, in various embodiments, may be a maximum amount of dirty write data, an optimal or desired amount of dirty write data, or the like. In one embodiment, the target amount of dirty write data is user defined. In another embodiment, the direct cache module 116b dynamically adjusts the target amount of dirty write data based on usage conditions of the cache 102 such as hit and miss rates for read data, write data, dirty data, clean data, and the like, a percentage of the cache 102 that stores data, or on other usage conditions. In one embodiment, the destaging pressure module 702 maintains a count or tally of the actual amount of dirty write data for the cache 102, adding to the count or tally as write data is cached in the cache 102 and subtracting from the count or tally as data is destaged to the backing store 118. In other embodiments, the destaging pressure module 702 may receive an indicator of the actual amount of dirty write data from the dirty indicator module 712, from the storage controller 104, or the like.

In one embodiment, the destaging rate module 704 adjusts a destaging rate for the cache 102 by adjusting a ratio of data to destage in cache log order using the log order module 722 to data to destage in backing store address order using the address order module 724. In a further embodiment, the destaging rate module 704 adjusts the destaging rate to satisfy the destaging pressure determined by the destaging pressure module 702. The destaging rate of the cache 102, in one embodiment, is the amount of data (in bytes or other data units) that the destage module 606 destages to the backing store 118 per unit of time.

In various embodiments, the destaging rate may satisfy the destaging pressure by moving the actual amount of dirty write data below the target amount of dirty write data, moving the actual amount of dirty write data within or below the target amount of dirty write data, or causing the actual amount of dirty write data to have another predefined relationship with respect to the target amount of dirty write data. In one embodiment, the destaging pressure module 702 and the destaging rate module 704 comprise a difference controller that receives the actual amount of dirty data and the target amount of dirty data and adjusts the destaging rate based on the difference between the actual and target amounts.

The destaging rate module 704, in one embodiment, toggles or alternates between destaging in cache log order using the log order module 722 and destaging in backing store address order using the address order module 724, to satisfy the destaging pressure. In an embodiment where the destaging rate module 704 toggles or alternates between destaging orders, the ratio of the orders may determine the duty cycle of time (number of cycles) spent destaging in cache log order and in backing store address order. In another embodiment where the destaging rate module 704 toggles or alternates between destaging orders, proportions of time spent destaging in cache log order versus destaging in backing store address order may be varied. For example, the time spent during destaging using one destaging order versus another order may be divided 60% to 40%. In addition, or alternatively, the destaging rate module 704 may change this proportion based on characteristics of the cache 102, the flash solid-state storage media 110, or the backing store 118.

In another embodiment, the destaging rate module 704 may determine a ratio that satisfies the destaging pressure by destaging in cache log order using the log order module 722 until the destaging pressure satisfies a predefined destaging pressure criteria, and destaging in the backing store address order using the address order module 724 in response to the destaging pressure satisfying the predefined destaging pressure criteria, or the like. A predefined destaging pressure criteria, in one embodiment, includes one or more rules, policies, and/or thresholds that trigger a change in the destaging operations of the cache 102. A predefined destaging pressure criteria may be based on a destage rate or other property associated with a destaging algorithm, characteristics of the cache 102, characteristics of the solid-state storage media 110, characteristics of the backing store 118, or the like. In one embodiment, the destaging rate module 704 may destage in backing store address order using the address order module 724 until the destaging pressure exceeds, falls below or otherwise satisfies the predefined destaging pressure criteria or threshold. The destaging rate module 704 may use the destaging pressure itself, a scaled or weighted product of the destaging pressure, an integral of the destaging pressure, or another criteria related to the destaging pressure as a predefined destaging pressure criteria.

In one embodiment, the destaging rate module 704 may destage data in cache log order using the log order module 722 and in backing store address order using the address order module 724 simultaneously in parallel. In a simultaneous or parallel embodiment, the destaging rate module 704 may adjust the ratio of cache log order destaging to backing store address order destaging by adjusting or throttling individual destaging rates of the log order module 722 and the address order module 724, or the like.

The direct mapping module 706, in one embodiment, directly maps logical or physical addresses of the backing store 118 ("backing store addresses") to logical addresses of the cache 102 and directly maps logical addresses of the cache 102 to the backing store addresses of the backing store 118. As used herein, direct mapping of addresses means that for a given address in a first address space there is exactly one corresponding address in a second address space with no translation or manipulation of the address to get from an address in the first address space to the corresponding address in the second address space. The direct mapping module 706, in a further embodiment, maps backing store addresses to logical addresses of the cache 102 such that each backing store 118 address has a one to one relationship with a logical address of the cache 102. As described above, in one embodiment, the logical addresses of the cache 102 are independent of the physical addresses of the physical storage media 110 for the cache 102 and the physical addresses of the physical storage media 110 of the cache 102 are fully associative with backing store addresses of the backing store 118.

In one embodiment, the direct mapping module 706 maps the backing store addresses directly to logical addresses of the cache 102 so that the backing store addresses of the backing store 118 and the logical addresses of the cache 102 are equal or equivalent. In one example of this embodiment, the backing store addresses and the logical addresses of the cache 102 share a lower range of the logical address space of the cache 102, such as addresses between about 0-232, or the like.

In one embodiment, the direct mapping module 706 directly maps logical addresses of the cache 102 to physical addresses and/or locations on the physical storage media 110 of the cache 102. In a further embodiment, the direct mapping module 706 uses a single mapping structure to map backing store addresses to logical addresses of the cache 102 and to map logical addresses of the cache 102 to locations on the physical storage media 110 of the cache 102. The mapping structure, in various embodiments, may include a B-tree, B*-tree, B+-tree, a CAM, a binary tree, a hash table, an index, an array, a linked-list, a look-up table, or another mapping data structure.

Use of a B-tree as the mapping structure m certain embodiments, is particularly advantageous where the logical address space presented to the client is a very large address space (such as 264 addressable blocks or the like—which may or may not be sparsely populated). Because B-trees maintain an ordered structure, searching such a large space remains very fast. Example embodiments of a B-tree as a mapping structure are described in greater detail with regard to FIGS. 8, 9, and 10. For example, in one embodiment, the mapping structure includes a B-tree with multiple nodes and each node may store several entries. In the example embodiment, each entry may map a variable sized range of logical addresses of the cache 102 to a location (such as a starting location) on the physical storage media 110 of the cache 102. Furthermore, the number of nodes in the B-tree may vary as the B-tree grows wider and/or deeper.

In one embodiment, the mapping structure of the direct mapping module 706 only includes a node or entry for logical addresses of the cache 102 that are associated with currently cached data in the cache 102. In this embodiment, membership in the mapping structure represents membership in the cache 102. The direct mapping module 706, in one embodiment, adds entries, nodes, and the like to the mapping structure as data is stored in the cache and removes entries, nodes, and the like from the mapping structure in response to data being evicted, cleared, trimmed, or otherwise removed from the cache 102.

Similarly, membership in the mapping structure may represent valid allocated blocks on the solid-state storage media 110. The solid-state storage controller 104 (and/or the direct mapping module 706), in one embodiment, adds entries, nodes, and the like to the mapping structure as data is stored on the solid-state storage media 110 and removes entries, nodes, and the like from the mapping structure in response to data being invalidated cleared, trimmed, or otherwise removed from the solid-state storage media 110. In the case where the mapping structure is shared for both cache management and data storage management on the solid-state storage media 110, the dirty indicator module 712 described below, in certain embodiments, may also track whether the data is dirty or not to determine whether the data is persisted on the backing store 118. The address order module 724, in a further embodiment, may also traverse the mapping structure to locate ranges of data in backing store address order, may request ranges of data in backing store address order from the direct mapping module 706, or the like.

In a further embodiment, the mapping structure of the direct mapping module 706 may include one or more nodes or entries for logical addresses of the cache 102 that are not associated with data currently stored in the cache 102, but that are associated with addresses of the backing store 118 that currently store data. The nodes or entries for logical addresses of the cache 102 that are not associated with data currently stored in the cache 102, in one embodiment, are not mapped to locations on the physical storage media 110 of the cache 102, but include a reference or indicator that the cache 102 does not store data corresponding to the logical addresses. The nodes or entries, in a further embodiment, may include information that the data resides in the backing store 118. For example, in certain embodiments, the mapping structure of the direct mapping module 706 may include nodes or entries for read misses, data of which the backing store 118 stores but the cache 102 does not currently store.

Nodes, entries, records, or the like of the mapping structure, in one embodiment, may include information (such as physical addresses, offsets, indicators, etc.) directly, as part of the mapping structure, or may include pointers, references, or the like for locating information in memory, in a table, or in another data structure. The direct mapping module 706, in one embodiment, optimizes the mapping structure by monitoring the shape of the mapping structure, monitoring the size of the mapping structure, balancing the mapping structure, enforcing one or more predefined rules with regard to the mapping structure, ensuring that leaf nodes of the mapping structure are at the same depth, combining nodes, splitting nodes, and/or otherwise optimizing the mapping structure.

The direct mapping module 706, in one embodiment, stores the mapping structure on the solid-state storage media 110 of the cache 102. By storing the mapping structure on the cache 102, in a further embodiment, the mapping of addresses of the backing store 118 to the logical addresses of the cache 102 and/or the mapping of the logical addresses of the cache 102 to locations on the physical storage media 110 of the cache 102 are persistent, even if the cache 102 is subsequently paired with a different host device 114. In one embodiment, the backing store 118 is also subsequently paired with the different host device 114. In a further embodiment, the cache 102 rebuilds or restores at least a portion of data from the backing store 118 on a new backing store storage device associated with the different host device 114, based on the mapping structure and data stored on the cache 102.

In one embodiment, the recent data module 708 prevents destaging of data within a predefined distance of an append point of the log of the cache 102. In certain embodiments, data within a predefined distance of the append point (e.g. the newest data on the log) may be more likely to be invalidated by a new write to the same corresponding backing store addresses. Data that is invalidated or logically overwritten by a subsequent write does not need to be destaged. The recent data module 708, in one embodiment, prevents the destage module 606 from destaging data within a most recent region adjacent to the append point to reduce the amount of dirty data that is destaged and subsequently invalidated or logically overwritten by a subsequent write. The recent data module 708, in various embodiments, may prevent the destage module 606 from destaging data within a predefined distance of an append point by verifying data eligibility for destaging for the destage module 606 prior to the destage module 606 destaging the data, by locking data from destaging using a locking data structure, by maintaining a destagable data table or other data structure for the destage module 606, or the like.

In one embodiment, the multiple append point module 710 maintains multiple append points for the log (or maintains multiple logs) of the cache 102. The multiple append points, in various embodiments, may be for a single log, for multiple sub-logs, for multiple separate logs, or the like. In a further embodiment, at least one append point is for writing dirty data and at least one append point is for writing clean data. In one embodiment, once the destage module 606 destages data from a dirty data portion of a log or a dirty data sub-log, the eviction module 716 may invalidate or evict the clean data and reclaim the corresponding storage space. Alternatively, the garbage collection module 714 may copy the clean data to a clean data portion of the log or a clean data sub-log. By using separate append points and/or logs to store dirty data and clean data, in certain embodiments, tracking dirty and clean data is simplified and may use little or no metadata overhead, or tracking data structures.

In one embodiment, the dirty indicator module 712 sets an indicator that the destage module 606 has destaged data to the backing store 118, such as the dirty data indicator described above with regard to FIG. 6 or the like, to track which data is clean and which data is dirty. The dirty indicator module 712, in one embodiment, sets the indicator that the backing store 118 stores the data once the destage module 606 has successfully written the data to the backing store 118. Setting the indicator (dirty/clean indicator) that the backing store 118 stores the data, in one embodiment, prevents the destage module 606 from destaging data a second time once the destage module 606 has already destaged the data. In a further embodiment, setting the indicator that the backing store 118 stores the data may alert a garbage collection or grooming process, such as the garbage collection module 714, that the data may be cleared from the cache 102 and/or alert an eviction process, such as the eviction module 716, that the data may be evicted from the cache 102, or the like.

In one embodiment, the dirty indicator module 712 sets an indicator that the backing store 118 stores data by marking the data as clean in the cache 102. In a further embodiment, the dirty indicator module 712 may set an indicator that the backing store 118 stores data by communicating an address of the data to the direct mapping module 706 or by sending a request to the direct mapping module 706 to update an indicator in a logical to physical mapping or other mapping structure. In another embodiment, the dirty indicator module 712 may set an indicator that the backing store 118 stores data by updating one or more indicators for a region of data in the cache 102, or the like. For example, in certain embodiments, the dirty indicator module 712 may maintain a bit field or bit array for one or more regions of the cache 102 representing which data is dirty and which data is clean within the one or more regions. In the bit fields or bit arrays, in one embodiment, each bit represents a packet, a page, a sector, a block, a range of data, or the like within a region, with one binary state indicating that the packet, page, sector, block, or range of data is dirty and the other binary state representing that the packet, page, sector, block, or range of data is clean.

Figure 10:
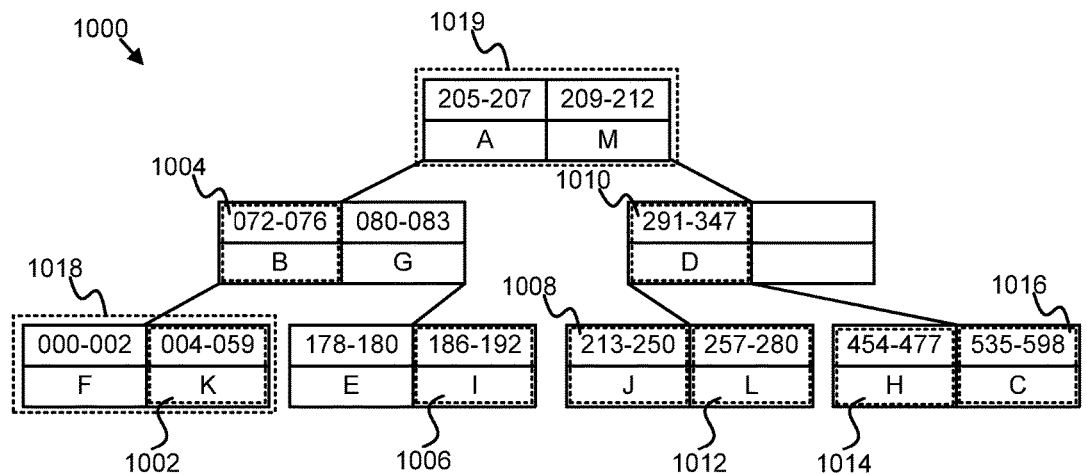
FIG. 10 is a schematic block diagram illustrating one embodiment of address order destaging and log order destaging in accordance with the present invention.
Figure 10:
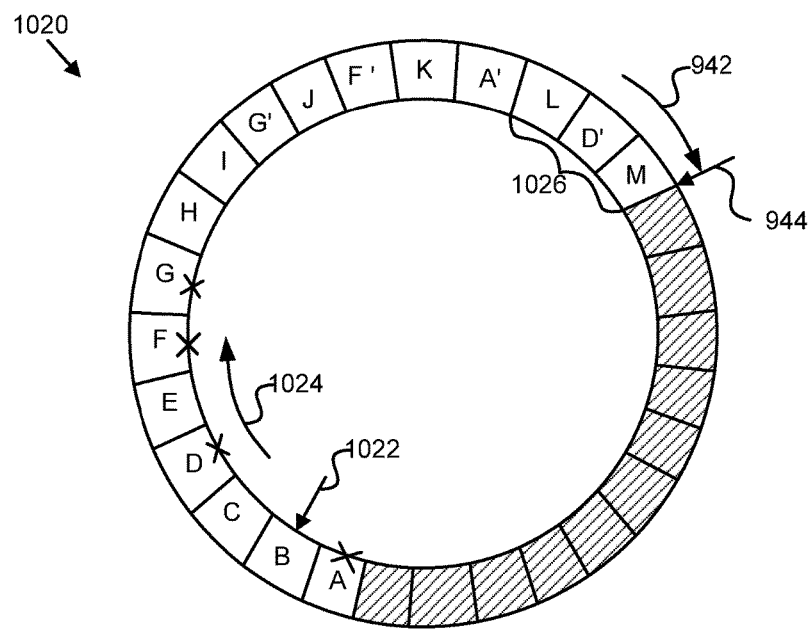

In one embodiment, where the destage module 606 uses the log order module 722 for destaging data in a cache log order, the dirty indicator module 712 may set an indicator that the backing store 118 stores data by moving a pointer representing a current destage point in the log. As described above, in certain embodiments, user write data to one side of the pointer may be dirty and user write data to the other side of the pointer may be clean. One embodiment of a pointer for a current destage point is depicted in FIG. 10. One of skill in the art, in light of this disclosure, will recognize other manners in which the dirty indicator module 712 may track dirty and clean data.

In one embodiment, the garbage collection module 714 recovers storage capacity of physical storage media 110 corresponding to data that is marked as invalid, such as data destaged by the destage module 606 and/or evicted by the eviction module 716. The garbage collection module 714, in one embodiment, recovers storage capacity of physical storage media corresponding to data that the destage module 606 has cleaned and that the eviction module 716 has evicted, or that has been otherwise marked as invalid. In one embodiment, the garbage collection module 714 allows clean data to remain in the cache 102 as long as possible until the eviction module 716 evicts the data or the data is otherwise marked as invalid, to decrease the number of cache misses.

In one embodiment, the garbage collection module 714 recovers storage capacity of physical storage media corresponding to invalid data opportunistically. For example, the garbage collection module 714 may recover storage capacity in response to a lack of available storage capacity, a percentage of data marked as invalid reaching a predefined threshold level, a consolidation of valid data, an error detection rate for a section of physical storage media reaching a threshold value, performance crossing a threshold value, a scheduled garbage collection cycle, identifying a section of the physical storage media 110 with a high amount of invalid data, identifying a section of the physical storage media 110 with a low amount of wear, or the like.

In one embodiment, the garbage collection module 714 relocates valid data that is in a section of the physical storage media 110 in the cache 102 that the garbage collection module 714 is recovering to preserve the valid data. The garbage collection module 714, in a further embodiment, relocates or copies forward dirty data that has not been destaged upon grooming the dirty data to preserve the dirty data. In another embodiment, the garbage collection module 714 may selectively relocate or copy forward clean data that has already been destaged. In one embodiment, the eviction module 716 determines which clean data to relocate and which clean data to erase without relocating. Erasing data without relocating the data evicts the data from the cache 102. The garbage collection module 714 and/or the eviction module 716, in one embodiment, may select which clean data remains in the cache and which clean data is evicted based on an eviction policy, a determined cost for the clean data, a frequency of use for the clean data, or the like. In another embodiment, the garbage collection module 714 clears or erases all clean data in a section of the physical storage media 110 that the garbage collection module 714 has selected for grooming.

In one embodiment, the garbage collection module 714 is part of an autonomous garbage collector system that operates within the cache 102. This allows the cache 102 to manage data so that data is systematically spread throughout the solid-state storage media 110, or other physical storage media, to improve performance, data reliability and to avoid overuse and underuse of any one location or area of the solid-state storage media 110 and to lengthen the useful life of the solid-state storage media 110.

The garbage collection module 714, upon recovering a section of the physical storage media 110, allows the cache 102 to re-use the section of the physical storage media 110 to store different data. In one embodiment, the garbage collection module 714 adds the recovered section of physical storage media to an available storage pool for the cache 102, or the like. The garbage collection module 714, in one embodiment, erases existing data in a recovered section. In a further embodiment, the garbage collection module 714 allows the cache 102 to overwrite existing data in a recovered section. Whether or not the garbage collection module 714, in one embodiment, erases existing data in a recovered section may depend on the nature of the physical storage media. For example, Flash media requires that cells be erased prior to reuse where magnetic media such as hard drives does not have that requirement. In an embodiment where the garbage collection module 714 does not erase data in a recovered section, but allows the cache 102 to overwrite data in the recovered section, the garbage collection module 714, in certain embodiments, may mark the data in the recovered section as unavailable to service read requests so that subsequent requests for data in the recovered section return a null result or an empty set of data until the cache 102 overwrites the data.

In one embodiment, the garbage collection module 714 recovers storage capacity of the cache 102 one or more storage divisions at a time. A storage division, in one embodiment, is an erase block or other predefined division. For flash memory, an erase operation on an erase block writes ones to every bit in the erase block. This is a lengthy process compared to a program operation which starts with a location being all ones, and as data is written, some bits are changed to zero. However, where the solid-state storage 110 is not flash memory or has flash memory where an erase cycle takes a similar amount of time as other operations, such as a read or a program, the eviction module 716 may erase the data of a storage division as it evicts data, instead of the garbage collection module 714.

In one embodiment, allowing the eviction module 716 to mark data as invalid rather than actually erasing the data and allowing the garbage collection module 714 to recover the physical media associated with invalid data, increases efficiency because, as mentioned above, for flash memory and other similar storage an erase operation takes a significant amount of time. Allowing the garbage collection module 714 to operate autonomously and opportunistically within the cache 102 provides a way to separate erase operations from reads, writes, and other faster operations so that the cache 102 operates very efficiently.

In one embodiment, the garbage collection module 714 is integrated with and/or works in conjunction with the destage module 606 and/or the eviction module 716. For example, the garbage collection module 714, in one embodiment, clears data from the cache 102 in response to an indicator that the storage device stores the data (i.e., that the destage module 606 has cleaned the data) based on a cache eviction policy (i.e., in response to the eviction module 716 evicting the data). The eviction module 716, in one embodiment, evicts data by marking the data as invalid. In other embodiments, the eviction module 716 may evict data by erasing the data, overwriting the data, trimming the data, deallocating physical storage media associated with the data, or otherwise clearing the data from the cache 102.

The eviction module 716, in one embodiment, evicts data from the cache 102 based on a cache eviction policy. The cache eviction policy, in one embodiment, is based on a combination or a comparison of one or more cache eviction factors. In one embodiment, the cache eviction factors include wear leveling of the physical storage media 110. In another embodiment, the cache eviction factors include a determined reliability of a section of the physical storage media 110. In a further embodiment, the cache eviction factors include a failure of a section of the physical storage media 110. The cache eviction factors, in one embodiment, include a least recently used ("LRU") block of data. In another embodiment, the cache eviction factors include a frequency of access of a block of data, i.e., how "hot" or "cold" a block of data is. In one embodiment, the cache eviction factors include a position of a block of data in the physical storage media 110 relative to other "hot" data. In a further embodiment, the cache eviction factors include an amount of read data in a block, an amount of write data in a block, an amount of dirty data in a block, an amount of clean data in a block, and/or other data composition factors for a block. One of skill in the art, in light of this disclosure, will recognize other cache eviction factors suitable for use in the cache eviction policy.

In one embodiment, the direct mapping module 706 determines one or more of the cache eviction factors based on a history of access to the mapping structure. The direct mapping module 706, in a further embodiment, identifies areas of high frequency, "hot," use and/or low frequency, "cold," use by monitoring accesses of branches or nodes in the mapping structure. The direct mapping module 706, in a further embodiment, determines a count or frequency of access to a branch, directed edge, or node in the mapping structure. In one embodiment, a count associated with each node of ab-tree like mapping structure may be incremented for each I/O read operation and/or each I/O write operation that visits the node in a traversal of the mapping structure. Of course, separate read counts and write counts may be maintained for each node. Certain counts may be aggregated to different levels in the mapping structure in other embodiments. The eviction module 716, in one embodiment, evicts data from the cache 102 intelligently and/or opportunistically based on activity in the mapping structure monitored by the direct mapping module 706, based on information about the physical storage media 110, and/or based on other cache eviction factors.

In a further embodiment, the eviction module 716 combines one or more cache eviction factors for a block of data or region of the cache 102 to form an eviction cost for the block, and compares the eviction costs of different blocks to determine which block to evict. In one embodiment, the eviction module 716 interfaces with the garbage collection module 714, and sends a selected block (such as an LEB, or the like) to the garbage collection module 714 for grooming, as described above. In another embodiment, the garbage collection module 714 erases clean data that has already been destaged in a block received from the eviction module 716 without relocating the clean data, effectively evicting the clean data of the selected block from the cache 102.

The direct mapping module 706, the eviction module 716, and/or the garbage collection module 714, in one embodiment, share information to increase the efficiency of the cache 102, to reduce cache misses, to make intelligent eviction decisions, and the like. In one embodiment, the direct mapping module 706 tracks or monitors a frequency that I/O requests access logical addresses in the mapping structure. The direct mapping module 706, in a further embodiment, stores the access frequency information in the mapping structure, communicates the access frequency information to the eviction module 716 and/or to the garbage collection module 714, or the like. The direct mapping module 706, in another embodiment, may track, collect, or monitor other usage/access statistics relating to the logical to physical mapping of addresses for the cache 102 and/or relating to the mapping between the logical address space of the cache 102 and the address space of the backing store 118, and may share that data with the eviction module 716 and/or with the garbage collection module 714.

One example of a benefit of sharing information between the destage module 606, the direct mapping module 706, the eviction module 716, and the garbage collection module 714, in certain embodiments, is that write amplification can be reduced. As described above, in one embodiment, the garbage collection module 714 copies any valid data in an erase block forward to the current append point of the log-based append-only writing structure of the cache 102 before recovering the physical storage capacity of the erase block. By cooperating with the destage module 606, the direct mapping module 706, and/or with the eviction module 716, in one embodiment, the garbage collection module 714 may clear certain valid data from an erase block without copying the data forward (for example because the replacement algorithm for the eviction module 716 indicates that the valid data is unlikely to be re-requested soon), reducing write amplification, increasing available physical storage capacity and efficiency. The garbage collection module 714 can even clear valid user write data from an erase block, so long as the destage module 606 has destaged the data to the backing store 118.

For example, m one embodiment, the garbage collection module 714 preserves valid data with an access frequency in the mapping structure that is above a predefined threshold, and clears valid data from an erase block if the valid data has an access frequency below the predefined threshold. In a further embodiment, the eviction module 716 may mark certain data as conditionally evictable, conditionally invalid, or the like, and the garbage collection module 714 may evict the conditionally invalid data based on an access frequency or other data that the direct mapping module 706 provides. In another example, the destage module 606, the direct mapping module 706, the eviction module 716, and the garbage collection module 714 may cooperate such that valid data that is in the cache 102 and is dirty gets stored on the backing store 118 by the destage module 606 rather than copied to the front of the log, because the eviction module 716 indicated that it is more advantageous to do so, or the like.

Those of skill in the art will appreciate a variety of other examples and scenarios in which the modules responsible for managing the non-volatile storage media 110 that uses a log-based append-only writing structure can leverage the information available in the direct cache module 116*b*. Furthermore, those of skill in the art will appreciate a variety of other examples and scenarios in which the modules responsible for managing the cache 102 (destage module 606, direct cache module 116*b*, garbage collection module 714, and/or eviction module 716) can leverage the information available in solid-state controller 104 regarding the condition of the non-volatile storage media 110.

In another example, the destage module 606, the direct mapping module 706, the eviction module 716, and/or the garbage collection module 714, in one embodiment, cooperate such that selection of one or more blocks of data by the eviction module 716 is influenced by the Uncorrectable Bit Error Rates ("UBER"), Correctable Bit Error Rates ("BER"), Program I Erase ("PE") cycle counts, read frequency, or other non-volatile solid state storage specific attributes of the region of the solid-state storage media 110 in the cache 102 that presently holds the valid data. High BER, UBER, PEs may be used as factors to increase the likelihood that the eviction module 716 will evict a particular block range stored on media having those characteristics.

In one embodiment, the read request module 718 services read requests for data stored in the cache 102 and/or the backing store 118. The read request module 718, in one embodiment, detects a read request to retrieve requested data from the backing store 118. In a further embodiment, the read request module 718 receives read requests from the host device 114. A read request is a read command with an indicator, such as a logical address or range of logical addresses, of the data being requested. In one embodiment, the read request module 718 supports read requests with several contiguous and/or noncontiguous ranges of logical addresses, as discussed above with regard to the write request module 602.

In the depicted embodiment, the read request module 718 includes a read miss module 728 and a read retrieve module 730. The read miss module 728, in one embodiment, determines whether or not requested data is stored in the cache 102. The read miss module 728 may query the cache 102 directly, query the direct mapping module 706, query the mapping structure of the direct mapping module 706, or the like to determine whether or not requested data is stored in the cache 102.

The read retrieve module 730, in one embodiment, returns requested data to the requesting entity, such as the host device 114. If the read miss module 728 determines that the cache 102 stores the requested data, in one embodiment, the read retrieve module 730 reads the requested data from the cache 102 and returns the data to the requesting entity. The direct mapping module 706, in one embodiment, provides the read retrieve module 730 with one or more physical addresses of the requested data in the cache 102 by mapping one or more logical addresses of the requested data to the one or more physical addresses of the requested data.

If the read miss module 728 determines that the cache 102 does not store the requested data, in one embodiment, the read retrieve module 730 reads the requested data from the backing store 118, writes the requested data to the cache 102, and returns the requested data to the requesting entity. In one embodiment, the read retrieve module 730 writes the requested data to the cache 102 by appending the requested data to an append point of a log-based writing structure of the cache 102. In a further embodiment, the read retrieve module 730 provides one or more physical addresses corresponding to the append point to the direct mapping module 706 with the one or more logical addresses of the requested data and the direct mapping module 706 adds and/or updates the mapping structure with the mapping of logical and physical addresses for the requested data. The read retrieve module 30, in one embodiment, writes the requested data to the cache 102 using and/or in conjunction with the cache write module 604.

In one embodiment, the read miss module 728 detects a partial miss, where the cache 102 stores one portion of the requested data but does not store another. A partial miss, in various embodiments, may be the result of eviction of the unstored data, a block I/O request for noncontiguous data, or the like. The read miss module 728, in one embodiment, reads the missing data or "hole" data from the backing store 118 and returns both the portion of the requested data from the cache 102 and the portion of the requested data from the backing store 118 to the requesting entity. In one embodiment, the read miss module 728 stores the missing data retrieved from the backing store 118 in the cache 102.

In one embodiment, the backing store interface module 720 provides an interface between the direct cache module 116*b*, the cache 102, and/or the backing store 118. As described above with regard to FIG. 5, in various embodiments, the direct cache module 116*b* interact with the cache 102 and/or the backing store 118 through a block device interface, a direct interface, a device driver on the host device 114, a storage controller, or the like. In one embodiment, the backing store interface module 720 provides the direct cache module 116*b* with access to one or more of these interfaces. For example, the backing store interface module 720 may receive read commands, write commands, and clear (or TRIM) commands from one or more of the cache write module 604, the direct mapping module 706, the read request module 718, the destage module 606, the garbage collection module 714, and the like and relay the commands to the cache 102 and/or the backing store 118. In a further embodiment, the backing store interface module 720 may translate or format a command into a format compatible with an interface for the cache 102 and/or the backing store 118.

In one embodiment, the backing store interface module 720 has exclusive ownership over the backing store 118 and the direct cache module 116*b* is an exclusive gateway to accessing the backing store 118. Providing the backing store interface module 720 with exclusive ownership over the backing store 118 and preventing access to the backing store 118 by other routes obviates stale data issues and cache coherency requirements, because all changes to data in the backing store 118 are processed by the direct cache module 116b.

In a further embodiment, the backing store interface module 720 does not have exclusive ownership of the backing store 118, and the backing store interface module 720 manages cache coherency for the cache 102. For example, in various embodiments, the backing store interface module 720 may access a common directory with other users of the backing store 118 to maintain coherency, may monitor write operations from other users of the backing store 118, may participate in a predefined coherency protocol with other users of the backing store 118, or the like.

Figure 8:
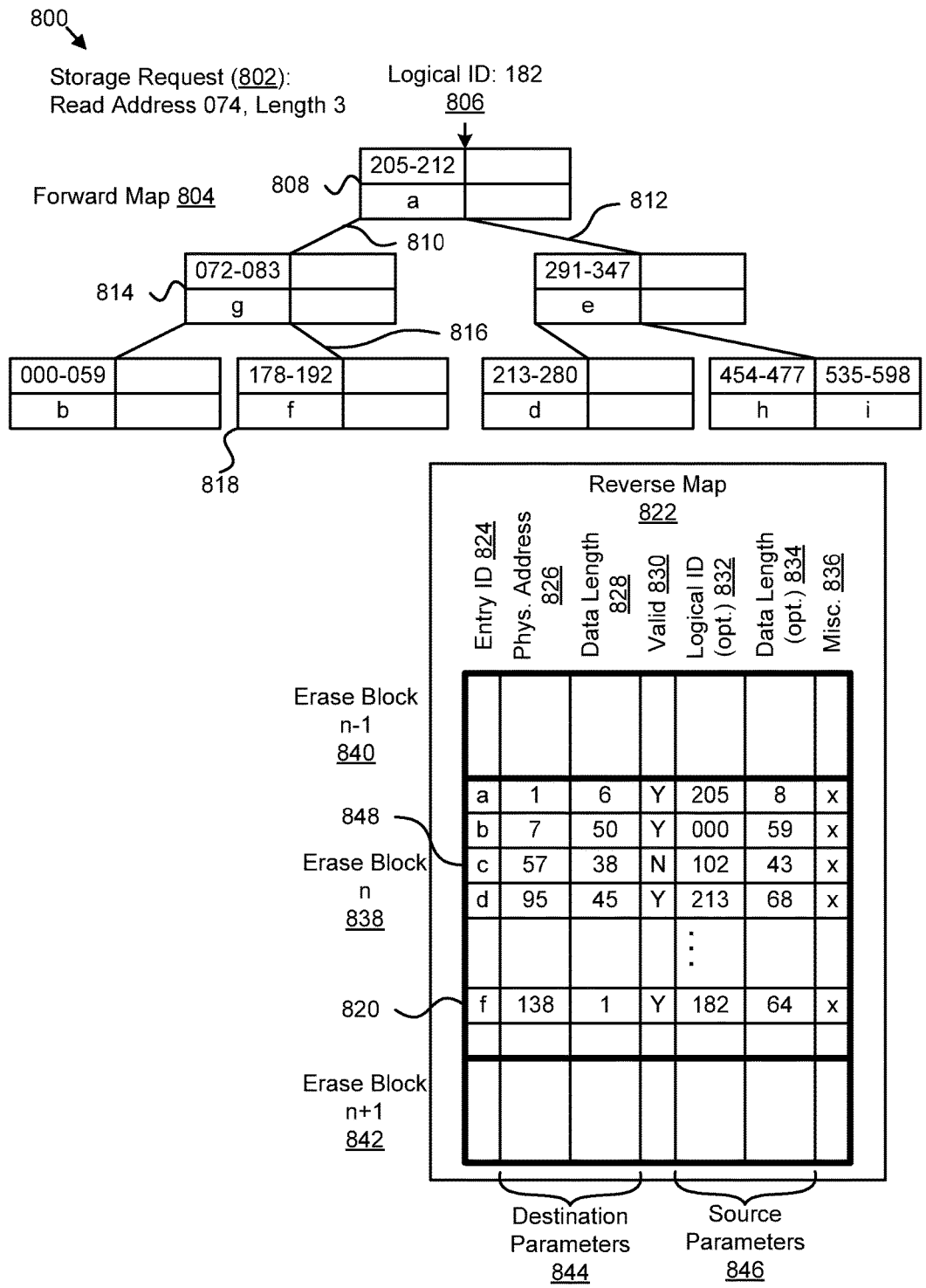
FIG. 8 is a schematic block diagram illustrating one embodiment of a forward map and a reverse map in accordance with the present invention.

FIG. 8 a schematic block diagram of an example of a forward map 804 and a reverse map 822 in accordance with the present invention. Typically, the direct cache module 116 detects and/or receives a storage request, such as storage request to read an address. For example, the direct cache module 116 may receive a logical block storage request 802 to start reading read address "182" and read 3 blocks. Typically the forward map 804 stores logical block addresses as virtual/logical addresses along with other virtual/logical addresses so the direct mapping module 706 uses forward map 804 to identify a physical address from the virtual/logical address "182" of the storage request 802. In the example, for simplicity, only logical addresses that are numeric are shown, but one of skill in the art will recognize that any logical address may be used and represented in the forward map 804. A forward map 804, in other embodiments, may include alpha-numerical characters, hexadecimal characters, and the like. The forward map 804 is one embodiment of a mapping structure described above with regard to the direct mapping module 706.

In the example, the forward map 804 is a simple B-tree. In other embodiments, the forward map 804 may be a CAM, a binary tree, a hash table, or other data structure known to those of skill in the art. In the depicted embodiment, a B-Tree includes nodes (e.g. the root node 808) that may include entries of two logical addresses. Each entry, in one embodiment, may include a range of logical addresses. For example, a logical address may be in the form of a logical identifier with a range (e.g. offset and length) or may represent a range using a first and a last address or location. In a further embodiment, each entry may include an indicator of whether the included range of data is dirty or clean (not shown).

Where a single logical address or range of logical addresses is included at a particular node, such as the root node 808, if a logical address 806 being searched is lower than the logical address or addresses of the node, the search will continue down a directed edge 810 to the left of the node 808. If the searched logical address 806 matches the current node 808 (i.e., is located within the range identified in the node), the search stops and the pointer, link, physical address, etc. at the current node 808 is identified. If the searched logical address 806 is greater than the range of the current node 808, the search continues down directed edge 812 to the right of the current node 808. Where a node includes two logical addresses or ranges of logical addresses and a searched logical address 806 falls between the listed logical addresses of the node, the search continues down a center directed edge (not shown) to nodes with logical addresses that fall between the two logical addresses or ranges of logical addresses of the current node 808. A search continues down the B-tree until either locating a desired logical address or determining that the searched logical address 806 does not exist in the B-tree. As described above, in one embodiment, membership in the B-tree denotes membership in the cache 102, and determining that the searched logical address 806 is not in the B-tree is a cache miss.

In the example depicted in FIG. 8, the direct mapping module 706 searches for logical address "182" 806 starting at the root node 808. Since the searched logical address 806 is lower than the logical address of 205-212 in the root node 808, the direct mapping module 706 searches down the directed edge 810 to the left to the next node 814. The searched logical address "182" 806 is greater than the logical address (072-083) stored in the next node 814 so the direct mapping module 706 searches down a directed edge 816 to the right of the node 814 to the next node 818. In this example, the next node 818 includes a logical address of 178-192 so that the searched logical address "182" 806 matches the logical address 178-192 of this node 818 because the searched logical address "182" 806 falls within the range 178-192 of the node 818.

Once the direct mapping module 706 determines a match in the forward map 804, the direct mapping module 706 returns a physical address, either found within the node 818 or linked to the node 818. In the depicted example, the node 818 identified by the direct mapping module 706 as containing the searched logical address 806 includes a link "f" that maps to an entry 820 in the reverse map 822.

In the depicted embodiment, for each entry 820 in the reverse map 822 (depicted as a row in a table), the reverse map 822 includes an entry ID 824, a physical address 826, a data length 828 associated with the data stored at the physical address 826 on the solid-state storage media 110 (in this case the data is compressed), a valid tag 830, a logical address 832 (optional), a data length 834 (optional) associated with the logical address 832, and other miscellaneous data 836. In a further embodiment, the reverse map 822 may include an indicator of whether the physical address 826 stores dirty or clean data, or the like. The reverse map 822 is organized into erase blocks (erase regions). In this example, the entry 820 that corresponds to the selected node 818 is located in erase block n 838. Erase block n 838 is preceded by erase block n−1 840 and followed by erase block n+1 842 (the contents of erase blocks n−1 and n+1 are not shown). An erase block may be some erase region that includes a predetermined number of pages. An erase region is an area in the solid-state storage media 110 erased together in a storage recovery operation.

While the entry ID 824 is shown as being part of the reverse map 822, the entry ID) 824 may be an address, a virtual link, or other means to tie an entry in the reverse map 822 to a node in the forward map 804. The physical address 826 is an address in the solid-state storage media 110 where data that corresponds to the searched logical address 806 resides. The data length 828 associated with the physical address 826 identifies a length of the data packet stored at the physical address 826. (Together the physical address 826 and data length 828 may be called destination parameters 844 and the logical address 832 and associated data length 834 may be called source parameters 846 for convenience.) In the example, the data length 828 of the destination parameters 844 is different from the data length 834 of the source parameters 846 in one embodiment compression the data packet stored on the solid-state storage media 110 was compressed prior to storage. For the data associated with the entry 820, the data was highly compressible and was compressed from 64 blocks t 1 block.

The valid tag 830 indicates if the data mapped to the entry 820 is valid or not. In this case, the data associated with the entry 820 is valid and is depicted in FIG. 8 as a "Y" in the row of the entry 820. Typically the reverse map 822 tracks both valid and invalid data and the forward map 804 tracks valid data. In the example, entry "c" 848 indicates that data associated with the entry 848 is invalid. Note that the forward map 804 does not include logical addresses associated with entry "c" 848. The reverse map 822 typically maintains entries for invalid data so that valid and invalid data can be quickly distinguished during a storage recovery operation. In certain embodiments, the forward map 804 and/or the reverse map 822 may track dirty and clean data in a similar manner to distinguish dirty data from clean data.

The depicted reverse map 822 includes source parameters 846 for convenience, but the reverse map 822 may or may not include the source parameters 846. For example, if the source parameters 846 are stored with the data, possibly in a header of the stored data, the reverse map 822 could identify a logical address indirectly by including a physical address 826 associated with the data and the source parameters 846 could be identified from the stored data. One of skill in the art will recognize when storing source parameters 846 in a reverse map 822 would be beneficial.

The reverse map 822 may also include other miscellaneous data 836, such as a file name, object name, source data, etc. One of skill in the art will recognize other information useful in a reverse map 822. While physical addresses 826 are depicted in the reverse map 822, in other embodiments, physical addresses 826, or other destination parameters 844, may be included in other locations, such as in the forward map 804, an intermediate table or data structure, etc.

Typically, the reverse map 822 is arranged by erase block or erase region so that traversing a section of the map associated with an erase block (e.g. erase block n 838) allows the garbage collection module 714 to identify valid data in the erase block 838 and to quantify an amount of valid data, or conversely invalid data, in the erase block 838. Similarly, the destage module 606, in certain embodiments, may traverse the reverse map 822 and/or the forward map 804 to locate dirty data for destaging, to quantify an amount of dirty data and/or clean data, or the like. Arranging an index into a forward map 804 that can be quickly searched to identify a physical address 826 from a logical address 806 and a reverse map 822 that can be quickly searched to identify valid data and quantity of valid data (and/or dirty data) in an erase block 838 is beneficial because the index may be optimized for searches, storage recovery, and/or destaging operations. One of skill in the art will recognize other benefits of an index with a forward map 804 and a reverse map 822.

Figure 9:
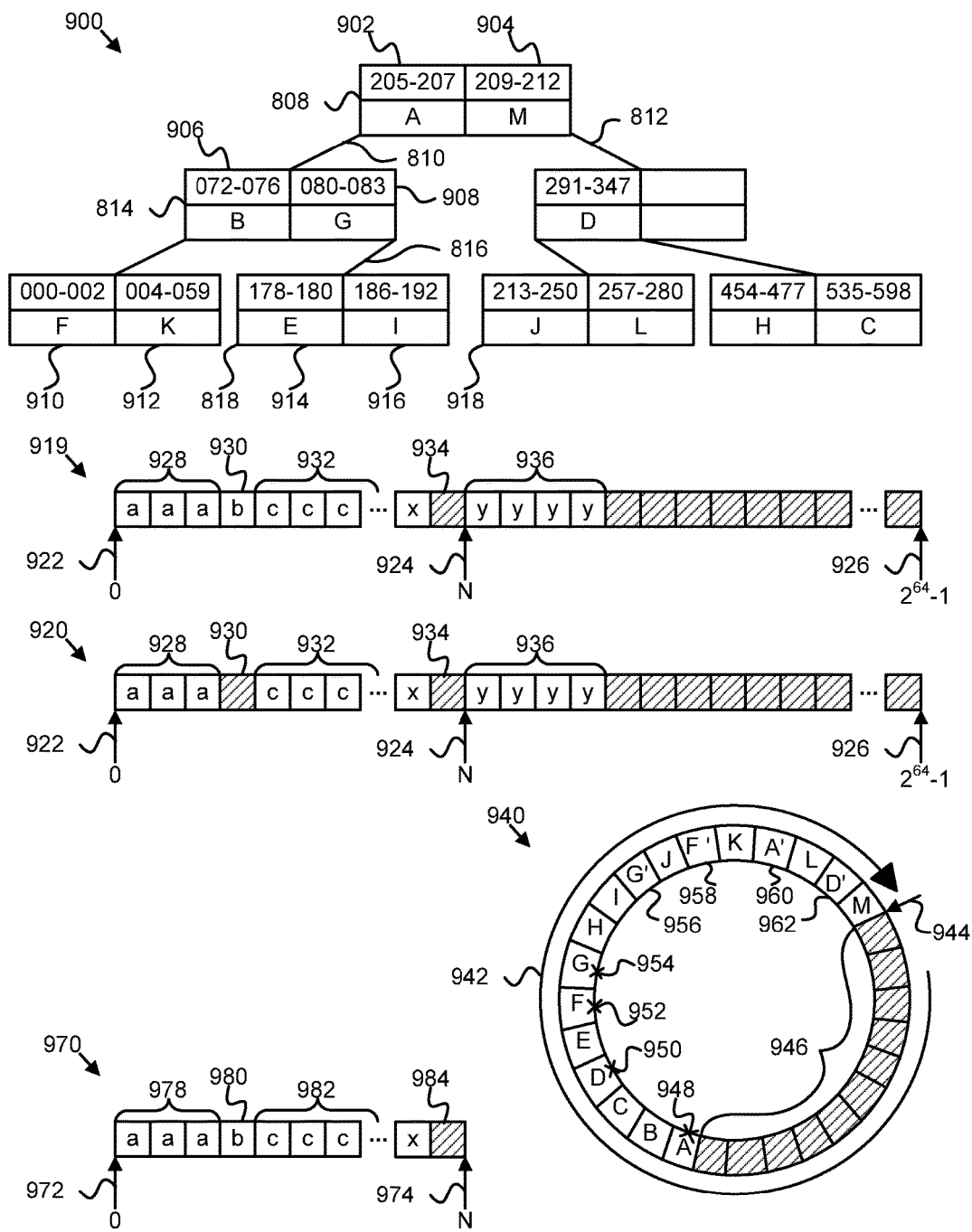
FIG. 9 is a schematic block diagram illustrating one embodiment of a mapping structure, a logical address space of a cache, a sequential, log-based, append-only writing structure, and an address space of a storage device in accordance with the present invention.

FIG. 9 depicts one embodiment of a mapping structure 900, a logical address space 920 of the cache 102, a combined logical address space 919 that is accessible to a storage client, a sequential, log-based, append-only writing structure 940, and a storage device address space 970 of the backing store 118. The mapping structure 900, in one embodiment, is maintained by the direct mapping module 706. The mapping structure 900, in the depicted embodiment, is a B-tree that is substantially similar to the forward map 804 described above with regard to FIG. 8, with several additional entries. Further, instead of links that map to entries in a reverse map 822, the nodes of the mapping structure 900 include direct references to physical locations in the cache 102. The mapping structure 900, in various embodiments, may be used either with or without a reverse map 822. As described above with regard to the forward map 804 of FIG. 8, in other embodiments, the references in the mapping structure 900 may include alpha-numerical characters, hexadecimal characters, pointers, links, and the like.

The mapping structure 900, in the depicted embodiment, includes a plurality of nodes. Each node, in the depicted embodiment, is capable of storing two entries. In other embodiments, each node may be capable of storing a greater number of entries, the number of entries at each level may change as the mapping structure 900 grows or shrinks through use, or the like. In a further embodiment, each entry may store one or more indicators of whether the data corresponding to the entry is clean or dirty, valid or invalid, read data or write data, or the like.

Each entry, in the depicted embodiment, maps a variable length range of logical addresses of the cache 102 to a physical location in the storage media 110 for the cache 102. Further, while variable length ranges of logical addresses, in the depicted embodiment, are represented by a starting address and an ending address, in other embodiments, a variable length range of addresses may be represented by a starting address and a length or by another representation. In one embodiment, the capital letters 'A' through 'M' represent a logical or physical erase block in the physical storage media 110 of the cache 102 that stores the data of the corresponding range of logical addresses. In other embodiments, the capital letters may represent other physical addresses or locations of the cache 102. In the depicted embodiment, the capital letters 'A' through 'M' are also depicted in the writing structure 940 which represents the physical storage media 110 of the cache 102. Although each range of logical addresses maps simply to an entire erase block, in the depicted embodiment, for simplicity of description, in other embodiments, a single erase block may store a plurality of ranges of logical addresses, ranges of logical addresses may cross erase block boundaries, and the like.

In the depicted embodiment, membership in the mapping structure 900 denotes membership (or storage) in the cache 102. In another embodiment, an entry may further include an indicator of whether the cache 102 stores data corresponding to a logical block within the range of logical addresses, data of the reverse map 822 described above, and/or other data. For example, in one embodiment, the mapping structure 900 may also map logical addresses of the backing store 118 to physical addresses or locations within the backing store 118, and an entry may include an indicator that the cache 102 does not store the data and a physical address or location for the data on the backing store 118. The mapping structure 900, in the depicted embodiment, is accessed and traversed in a similar manner as that described above with regard to the forward map 804.

In the depicted embodiment, the root node 808 includes entries 902, 904 with noncontiguous ranges of logical addresses. A "hole" exists at logical address "208" between the two entries 902, 904 of the root node. In one embodiment, a "hole" indicates that the cache 102 does not store data corresponding to one or more logical addresses corresponding to the "hole." In one embodiment, a "hole" may exist because the eviction module 716 evicted data corresponding to the "hole" from the cache 102. If the eviction module 716 evicted data corresponding to a "hole," in one embodiment, the backing store 118 still stores data corresponding to the "hole." In another embodiment, the cache 102 and/or the backing store 118 supports block I/O requests (read, write, trim, etc.) with multiple contiguous and/or noncontiguous ranges of addresses (i.e., ranges that include one or more "holes" in them). A "hole," in one embodiment, may be the result of a single block I/O request with two or more noncontiguous ranges of addresses. In a further embodiment, a "hole" may be the result of several different block I/O requests with address ranges bordering the "hole."

In FIG. 8, the root node 808 includes a single entry with a logical address range of "205-212," without the hole at logical address "208." If the entry of the root node 908 were a fixed size cache line of a traditional cache, the entire range of logical addresses "205-212" would be evicted together. Instead, in the embodiment depicted in FIG. 9, the eviction module 716 evicts data of a single logical address "208" and splits the range of logical addresses into two separate entries 902, 904. In one embodiment, the direct mapping module 706 may rebalance the mapping structure 900, adjust the location of a directed edge, root node, or child node, or the like in response to splitting a range of logical addresses. Similarly, in one embodiment, each range of logical addresses may have a dynamic and/or variable length, allowing the cache 102 to store dynamically selected and/or variable lengths of logical block ranges.

In the depicted embodiment, similar "holes" or noncontiguous ranges of logical addresses exist between the entries 906, 908 of the node 814, between the entries 910, 912 of the left child node of the node 814, between entries 914, 916 of the node 818, and between entries of the node 918. In one embodiment, similar "holes" may also exist between entries in parent nodes and child nodes. For example, in the depicted embodiment, a "hole" of logical addresses "060-071" exists between the left entry 906 of the node 814 and the right entry 912 of the left child node of the node 814.

The "hole" at logical address "003," in the depicted embodiment, can also be seen in the logical address space 920 of the cache 102 at logical address "003" 930. The hash marks at logical address "003" 940 represent an empty location, or a location for which the cache 102 does not store data. In the depicted embodiment, storage device address "003" 980 of the storage device address space 970 does store data (identified as 'b'), indicating that the eviction module 716 evicted data from logical address "003" 930 of the cache 102. The "hole" at logical address 934 in the logical address space 920, however, has no corresponding data in storage device address 984, indicating that the "hole" is due to one or more block I/O requests with noncontiguous ranges, a trim or other deallocation command to both the cache 102 and the backing store 118, or the like.

The "hole" at logical address "003" 930 of the logical address space 920, however, in one embodiment, is not viewable or detectable to a storage client. In the depicted embodiment, the combined logical address space 919 represents the data that is available to a storage client, with data that is stored in the cache 102 and data that is stored in the backing store 118 but not in the cache 102. As described above, the read miss module 728 of FIG. 7 handles misses and returns requested data to a requesting entity. In the depicted embodiment, if a storage client requests data at logical address "003" 930, the read miss module 728 will retrieve the data from the backing store 118, as depicted at address "003" 980 of the storage device address space 970, and return the requested data to the storage client. The requested data at logical address "003" 930 may then also be placed back in the cache 102 and thus logical address 930 would indicate 'b' as present in the cache 102.

For a partial miss, the read miss module 728 may return a combination of data from both the cache 102 and the backing store 118. For this reason, the combined logical address space 919 includes data 'b' at logical address "003" 930 and the "hole" in the logical address space 920 of the cache 102 is transparent. In the depicted embodiment, the combined logical address space 919 is the size of the logical address space 920 of the cache 102 and is larger than the storage device address space 980. In another embodiment, the direct cache module 116 may size the combined logical address space 919 as the size of the storage device address space 980, or as another size.

The logical address space 920 of the cache 102, in the depicted embodiment, is larger than the physical storage capacity and corresponding storage device address space 970 of the backing store 118. In the depicted embodiment, the cache 102 has a 64 bit logical address space 920 beginning at logical address "0" 922 and extending to logical address "264-1" 926. The storage device address space 970 begins at storage device address "0" 972 and extends to storage device address "N" 974. Storage device address "N" 974, in the depicted embodiment, corresponds to logical address "N" 924 in the logical address space 920 of the cache 102. Because the storage device address space 970 corresponds to only a subset of the logical address space 920 of the cache 102, the rest of the logical address space 920 may be shared with an additional cache 102, may be mapped to a different backing store 118, may store data in the cache 102 (such as a Non-volatile memory cache) that is not stored in the storage device 970, or the like.

For example, in the depicted embodiment, the first range of logical addresses "000-002" 928 stores data corresponding to the first range of storage device addresses "000-002" 978. Data corresponding to logical address "003" 930, as described above, was evicted from the cache 102 forming a "hole" and a potential cache miss. The second range of logical addresses "004-059" 932 corresponds to the second range of storage device addresses "004-059" 982. However, the final range of logical addresses 936 extending from logical address "N" 924 extends beyond storage device address "N" 974. No storage device address in the storage device address space 970 corresponds to the final range of logical addresses 936. The cache 102 may store the data corresponding to the final range of logical addresses 936 until the data backing store 118 is replaced with larger storage or is expanded logically, until an additional data backing store 118 is added, simply use the non-volatile storage capability of the cache 102 to indefinitely provide storage capacity directly to a storage client 504 independent of a backing store 118, or the like. In a further embodiment, the direct cache module 116 alerts a storage client 504, an operating system, a user application 502, or the like in response to detecting a write request with a range of addresses, such as the final range of logical addresses 936, that extends beyond the storage device address space 970. The user may then perform some maintenance or other remedial operation to address the situation. Depending on the nature of the data, no further action may be taken. For example, the data may represent temporary data which if lost would cause no ill effects.

The sequential, log-based, append-only writing structure 940, in the depicted embodiment, is a logical representation of the log preserved in the physical storage media 110 of the cache 102. In a further embodiment, the backing store 118 may use a substantially similar sequential, log-based, append-only writing structure 940. In certain embodiments, the cache 102 stores data sequentially, appending data to the writing structure 940 at an append point 944. The cache 102, in a further embodiment, uses a storage space recovery process, such as the garbage collection module 714 that re-uses non-volatile storage media 110 storing deallocated, unused, or evicted logical blocks. Non-volatile storage media 110 storing deallocated, unused, or evicted logical blocks, in the depicted embodiment, is added to an available storage pool 946 for the cache 102. By evicting and clearing certain data from the cache 102, as described above, and adding the physical storage capacity corresponding to the evicted and/or cleared data back to the available storage pool 946, in one embodiment, the writing structure 940 is ring-like and has a theoretically infinite capacity.

In the depicted embodiment, the append point 944 progresses around the log-based, append-only writing structure 940 in a circular pattern 942. In one embodiment, the circular pattern 942 wear balances the solid-state storage media 110, increasing a usable life of the solid-state storage media 110. In the depicted embodiment, the eviction module 716 and/or the garbage collection module 714 have marked several blocks 948, 950, 952, 954 as invalid, represented by an "X" marking on the blocks 948, 950, 952, 954. The garbage collection module 714, in one embodiment, will recover the physical storage capacity of the invalid blocks 948, 950, 952, 954 and add the recovered capacity to the available storage pool 946. In the depicted embodiment, modified versions of the blocks 948, 950, 952, 954 have been appended to the writing structure 940 as new blocks 956, 958, 960, 962 in a read, modify, write operation or the like, allowing the original blocks 948, 950, 952, 954 to be recovered. In further embodiments, the garbage collection module 714 may copy forward to the append point 944 any dirty data and selectively any valid data that the blocks 948, 950, 952, 954 store, if any.

FIG. 10 depicts one embodiment of address order destaging using a mapping structure 1000 and log order destaging using a log 1020 in accordance with the present invention. As described above, in various embodiments, the destage module 606 may destage data from the cache 102 to the backing store 118 in cache log order using the log order module 722, in backing store address order using the address order module 724, or both.

In one embodiment, the address order module 724 traverses the mapping structure 1000 to locate one or more ranges of backing store addresses for destaging. As described above with regard to the mapping structure 900 of FIG. 9, the logical addresses of the cache 102 stored in the mapping structure 1000, in the depicted embodiment, are also the backing store addresses of the backing store 118. Destaging data in logical address order based on ranges of logical addresses in the mapping structure 1000, in certain embodiments, is also destaging in backing store address order, as the logical addresses are directly mapped to backing store addresses. In another embodiment where backing store addresses are not directly mapped to logical addresses of the cache 102, the mapping structure 1000 may map backing store addresses to logical and/or physical addresses of the cache 102.

The address order module 724, in one embodiment, locates ranges of backing store addresses for destaging that correspond to dirty write data that has not yet been destaged to the backing store 118. Entries of the mapping structure 1000, in one embodiment, include indicators of whether the data corresponding to the entry is clean or dirty. In a further embodiment, the address order module 724 may reference a reverse map, a data structure of the dirty indicator module 712, or the like to determine whether data corresponding to an entry in the mapping structure 1000 is clean or dirty. In one embodiment, the direct mapping module 706 may maintain separate mapping structures for dirty data and for clean data, and the mapping structure 1000 may include just entries for dirty data.

In one embodiment, the address order module 724 selects one or more ranges of backing store addresses for destaging that include at least a predefined sequential threshold number of contiguous, sequential backing store addresses. For example, in the depicted embodiment, entries 1002, 1004, 1006, 1008, 1010, 1012, and 1014 each include a range of five or more sequential, contiguous, backing store addresses, and would satisfy a predefined sequential threshold of five.

In a further embodiment, the address order module 724 may combine entries to form a range of backing store addresses with one or more holes. For example, in certain embodiments, the address order module 724 may combine adjacent entries 1018 with backing store addresses "000-002" and "004-059" and/or may combine adjacent entries 1019 with backing store addresses "205-207" and "209-212" for destaging, even with holes at backing store address "003" and backing store address "208." In other embodiments, a hole may comprise multiple backing store addresses. In one embodiment, the address order module 724 combines ranges of backing store addresses that together include at least a predefined sequential threshold amount of sequential backing store addresses, even if the ranges are not contiguous.

The address order module 724, in one embodiment, may traverse the mapping structure 1000 in backing store address order and destage ranges of data in backing store address order. For example, in the depicted embodiment, with a predefined sequential threshold amount of five and without combining ranges, the address order module 724 may destage entry "004-059" 1002, destage entry "072-076" 1004, destage entry "186-192" 1006, destage entry "213-250" 1008, destage entry "291-347" 1010, destage entry "257-280" 1012, destage entry "454-477" 1014, and destage entry "535-598" 1016 in numerical address order, provided the entries 1002, 1004, 1006, 1008, 1010, 1012, 1014, 1016 each comprise dirty write data.

In another embodiment, the address order module 724 may traverse the mapping structure 1000 in a different order, such as by level in the B-tree of the mapping structure 1000, from top to bottom, bottom to top, or the like. In a further embodiment, the address order module 724 may traverse the mapping structure 1000 based on one or more statistics of the mapping structure 1000. For example, in one embodiment, the direct mapping module 706 may maintain access statistics for each entry, node, and/or branch of the mapping structure 1000, and the address order module 724 may begin destaging ranges of backing store addresses that are least accessed or "coldest," and proceed with destaging in a least accessed order, or the like. In another embodiment, the address order module 724 may select ranges of backing store addresses for destaging from the largest range toward the smallest range, destaging larger ranges of backing store addresses first.

In one embodiment, the log order module 722 destages in cache log order along the log 1020. In the depicted embodiment, the log order module 722 maintains a pointer 1022 indicating a position in the log 1020 at which the log order module 722 is currently destaging data. The log order module 722, in the depicted embodiment, moves the pointer 1022 along the log 1020 in a logically circular pattern 1024, moving from the tail of the log 1020 (i.e., the oldest data) toward the head of the log 1020 (i.e. the newest data). The log order module 722, in one embodiment, skips data, such as the depicted block "A," that has been invalidated by a subsequent write, such as the depicted block "A'," by being copied forward on the log 1020, or the like. In one embodiment, the recent data module 708 prevents the log order module 722 and/or the address order module 724 from destaging data within a predefined distance 1026 of the append point 944.

The log order module 722, in various embodiments, may determine what data in a block is dirty using a reverse map, a data structure of the dirty indicator module 712, data stored with each block of the log 1020, or the like to determine what data of each region or block of the log 1020 is dirty. In one embodiment, the cache 102 may include one or more separate append points 944 and/or separate logs 1020 for dirty data, and the log 1020 may include just dirty data for destaging, or the like. In certain embodiments, as the log order module 722 selects regions or blocks of the log 1020 for destaging, the re-order module 726 re-orders data within the region or block into backing store address order for destaging.

Figure 11:
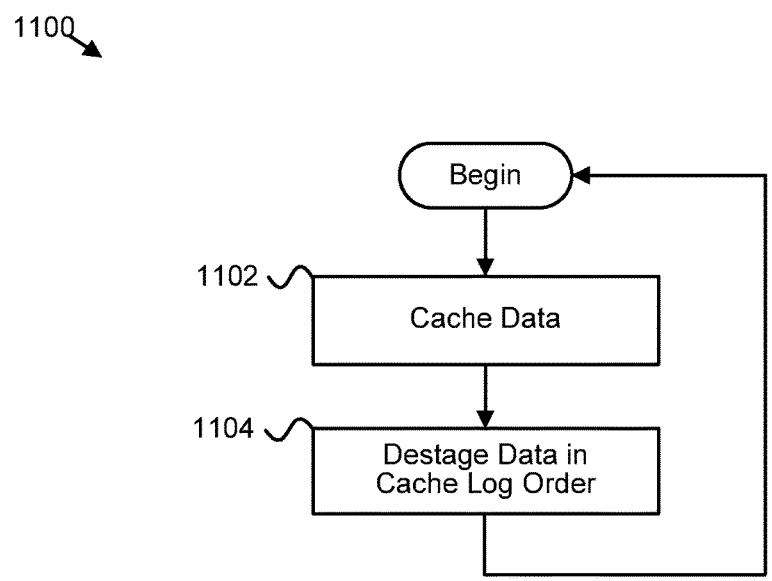
FIG. 11 is a schematic flow chart diagram illustrating one embodiment of a method for destaging cached data in accordance with the present invention.

FIG. 11 depicts one embodiment of a method 1100 for destaging cached data in accordance with the present invention. The method 1100 begins, and the cache write module 604 caches 1102 data corresponding to the write request in the cache 102. The destage module 606, in the depicted embodiment, de stages 1104 data, such as dirty write data or the like, from the cache 102 to the backing store 118 in cache log order. The write request module 602, in the depicted embodiment, continues to detect 1102 write requests.

Figure 12:
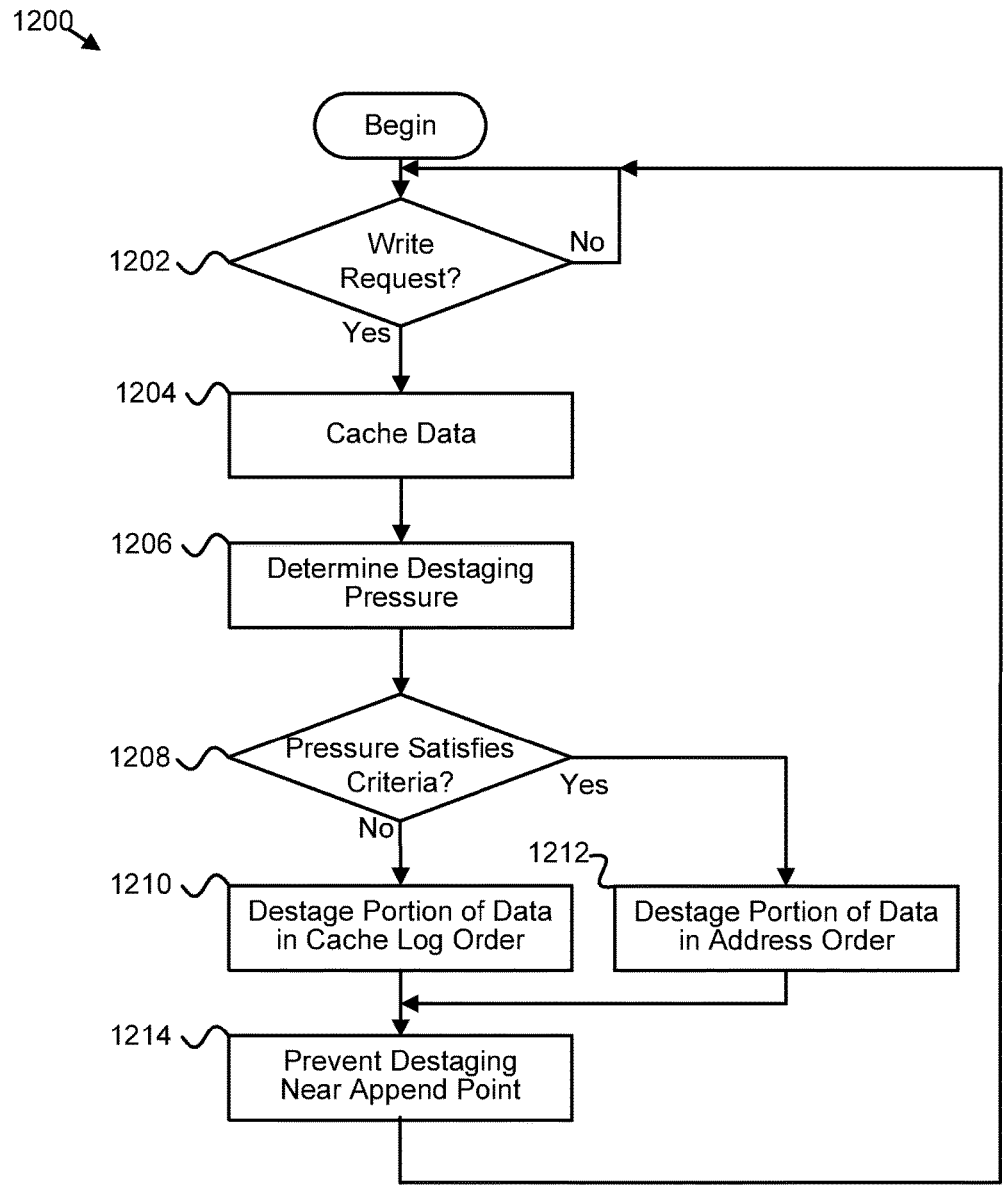
FIG. 12 is a schematic flow chart diagram illustrating another embodiment of a method for destaging cached data in accordance with the present invention.

FIG. 12 depicts another embodiment of a method 1200 for destaging cached data in accordance with the present invention. The method 1200 begins, and the write request module 602 detects 1202 whether or not a write request has been made to store data on the backing store 118. If the write request module 602 does not detect 1202 a write request, the write request module 602 continues to detect 1202 write requests.

In the depicted embodiment, if the write request module 602 detects 1202 a write request, the cache write module 604 caches 1204 data corresponding to the write request in the cache 102. The destaging pressure module 702, in the depicted embodiment, determines 1206 a destaging pressure for the cache 102. As described above with regard to the destaging pressure module 702 of FIG. 7, a de staging pressure is a level of demand for destaging cached data of the cache 102. The destaging rate module 704, in the depicted embodiment, determines 1208 whether the destaging pressure satisfies a predefined destaging pressure criteria. If the destaging rate module 704 determines 1208 that the destaging pressure does not satisfy the predefined destaging pressure criteria, the log order module 722 destages 1210 at least a portion of dirty write data in the cache 102 in a cache log order. If the destaging rate module 704 determines 1208 that the destaging pressure does satisfy the predefined destaging pressure criteria, the address order module 724 destages 1212 at least a portion of dirty write data in the cache 102 in a backing store address order.

The recent data module 708, in the depicted embodiment, prevents 1214 the log order module 722 and the address order module 724 from destaging data near or within a predefined distance of an append point of the log. The write request module 602, in the depicted embodiment, continues to detect 1202 write requests.

Figure 13:
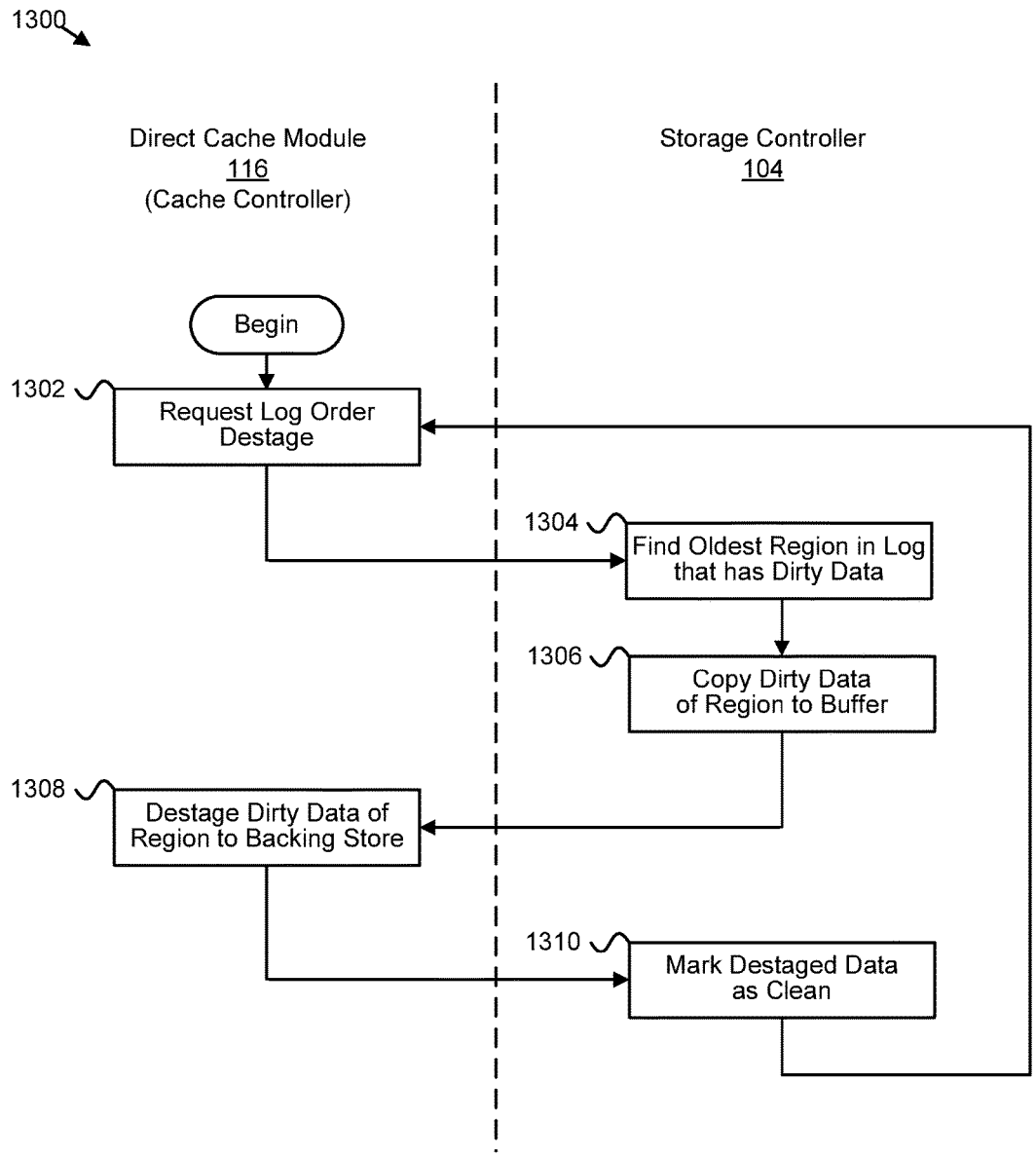
FIG. 13 is a schematic flow chart diagram illustrating one embodiment of a method for log order destaging in accordance with the present invention.

FIG. 13 depicts one embodiment of a method 1300 for log order destaging in accordance with the present invention. In the depicted embodiment, the method 1300 begins, and the direct cache module 116, also referred to as a cache controller, makes a log order destaging request 1302 to the storage controller 104 of the cache 102. In response to the log order destaging request 1302, the storage controller 104 finds 1304 an oldest region in a log of the cache 102 that has dirty data. The storage controller 104, in the depicted embodiment, copies 1306 the dirty data from the oldest region in the log to a buffer. In one embodiment, the storage controller 104 may copy 1306 the dirty data in backing store address order, re-ordering the dirty data if necessary. In certain embodiments, the storage controller 104 may lock the selected region, mark the selected region as not groomable, or the like. In a further embodiment, the storage controller 104 may allow the selected region to be groomed during the destaging process, since the storage controller 104 copied the dirty data to the buffer for destaging and the dirty data remains accessible to the direct cache module 116 in the buffer.

The direct cache module 116, in the depicted embodiment, destages 1308 the dirty data of the oldest region with dirty data from the buffer to the backing store 118. The direct cache module 116, in one embodiment, destages 1308 or writes the dirty data of the oldest region to the backing store 118 in cache log order, the order in which data was stored to the region. In a further embodiment, the direct cache module 116 may destage 1308 or write the dirty data of the oldest region to the backing store 118 re-ordered in a backing store address order.

In one embodiment, the destaging 1308 is canceled or stopped in response to receiving a write request writing data to addresses selected for destaging. In a further embodiment, the destaging 1308 may continue in response to an invalidating write request and the new write data is subsequently destaged 1308 to overwrite the invalid data. In response to the direct cache module 116 completing the destaging 1308, the storage controller 104 marks 1310 the destaged data as clean in the cache 102, unless the data has been invalidated by a subsequent write, or the like. In certain embodiments, if a grooming process of the storage controller 104 copied the data forward during the destaging 1308, the storage controller 104 marks the data clean in the data's new location. In the depicted embodiment, the method 1300 continues and the direct cache module 116 requests 1302 additional log order destaging.

Figure 14:
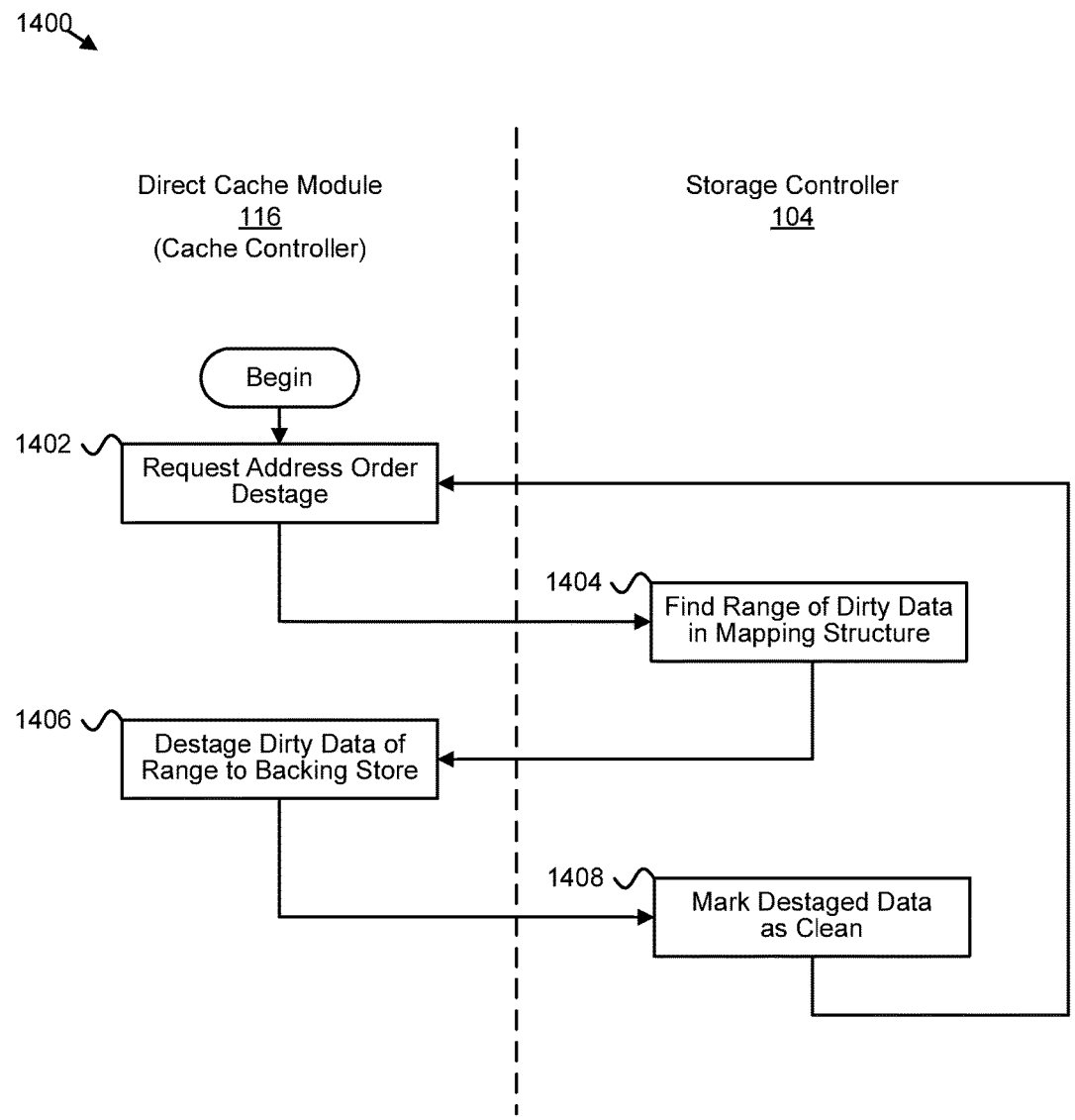
FIG. 14 is a schematic flow chart diagram illustrating one embodiment of a method for address order destaging in accordance with the present invention.

FIG. 14 depicts one embodiment of a method 1400 for address order destaging in accordance with the present invention. In the depicted embodiment, the direct cache module 116, or cache controller, sends 1402 a request for backing store address order destaging to the storage controller 104 of the cache 102. The storage controller 104, in the depicted embodiment, finds 1404 a range of dirty data in backing store address order in a mapping structure of the cache 102 and sends the range of dirty data (or associated addresses) to the direct cache module 116, to data storage accessible to the direct cache module 116, or the like.

The direct cache module 116, in the depicted embodiment, destages 1406 the dirty data of the selected range to the backing store 118. In certain embodiments, the storage controller 104 may queue any invalidating write requests that overlap the selected range of dirty data until the direct cache module 116 completes the destaging 1406, or the like. The storage controller 104, in the depicted embodiment, marks 1408 the destaged data as clean in the cache 102. In certain embodiments, if a grooming process of the storage controller 104 copied the data forward during the destaging 1406, the storage controller 104 marks the data clean in the data's new location. In the depicted embodiment, the method 1400 continues and the direct cache module 116 requests 1402 additional backing store address order destaging.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for destaging cached data, the method comprising:
caching data corresponding to write requests pertaining to a backing store, the data written to cache storage as dirty cache data, the cache storage comprising an ordered log maintained on a nonvolatile storage medium; and
performing destage operations to destage cache to the backing store, wherein performing a destage operation comprises:
determining a destage metric for the cache storage, the destage metric corresponding to an amount of dirty cache data within the cache storage;
using a first criterion to select data from the cache storage for the destage operation in response to the destage metric exceeding a threshold, the first criterion corresponding to a sequential backing store address order; and
using a second criterion, different from the first criterion, to select the data from the cache storage for the destage operation in response to the destage metric failing to exceed the threshold, the second criterion corresponding to a log order.

2. The method of claim 1, wherein determining the destage metric comprises maintaining a tally of the amount of dirty cache data currently stored within the cache storage.

3. The method of claim 1, wherein performing the destage operations further comprises:
adjusting a destaging rate of the destage operations based on the destage metric.

4. The method of claim 1, wherein:
the first criterion corresponds to a sequential backing store address order, such that data are selected from the cache storage based on backing store addresses associated with the data.

5. The method of claim 4, wherein selecting data using the first criterion comprises traversing a mapping structure that maps backing store addresses to locations on physical storage media of the nonvolatile storage medium and selecting a destage data range such that members of the data range have contiguous and sequential backing store addresses.

6. The method of claim 4, wherein:
each backing store address directly maps to a logical address of a logical address space associated with the nonvolatile storage medium; and
logical addresses of the cache storage are independent of physical storage media addresses of the nonvolatile storage medium.

7. The method of claim 1, wherein a destage rate for destage operations using the first criterion is higher than a destage rate for destage operations using the second criterion.

8. The method of claim 1, further comprising preventing destaging of data within a predefined distance of an append point of the ordered log of the nonvolatile solid-state cache.

9. The method of claim 1, wherein determining the destage metric comprises determining a difference between an actual amount of dirty cache data within the cache storage and a target amount of dirty cache data.

10. The method of claim 1, wherein:
the second criterion corresponds to a log order; and
selecting data using the second criterion comprises selecting data within one of a plurality of regions of the ordered log, the regions ordered in the log order.

11. The method of claim 10, further comprising:
destaging data from a designated region of the ordered log; and
re-ordering data of the designated region to a backing store address order.

12. The method of claim 1, wherein the ordered log comprises multiple append points for writing cached data, the multiple append points comprising at least one append point for writing dirty cache data and at least one append point for writing clean cache data, the clean cache data comprising cache data that is stored in the backing store.

13. An apparatus, comprising:
means for sending write requests pertaining to a backing store to a storage controller, the storage controller configured to cache data associated with the write requests in a log, the log comprising a sequential, log-based structure stored within a nonvolatile solid-state storage device;
means for determining an amount of data cached within the nonvolatile solid-state storage device that has not been destaged to the backing store;
means for using a sequential backing store address order for the destaging when the determined amount exceeds a threshold; and
means for using a log order for the destaging when the determined amount does not exceed the threshold.

14. The apparatus of claim 13, wherein the threshold defines a target amount of dirty write data to cache within the nonvolatile solid-state storage device.

15. The apparatus of claim 13, further comprising means for determining the amount of data cached within the nonvolatile solid-state storage device that has not been destaged to the backing store.

16. The apparatus of claim 13, wherein the means for sending, the means for determining, the means for using a sequential backing store address order, and the means for using a log order comprise a device driver executing on a host computer system.

17. A system, comprising:
a cache comprising a log maintained within a nonvolatile solid-state storage device, the log comprising a sequential, log-based structure;
a backing store;
a cache controller configured to admit dirty write data into the cache in response to write requests pertaining to the backing store, the dirty write data appended to the log maintained within the nonvolatile solid-state storage device; and
a destage module configured to destage dirty write data from the cache to the backing store, by:
determining a destage pressure on the cache, the determined destage pressure corresponding to an amount of dirty write data cached within the log;
destaging dirty write data from the cache according to a sequential backing store address ordering of the dirty write data within the cache in response to the determined destage pressure satisfying a threshold; and
destaging dirty write data from the cache according to a log ordering of the dirty write data within the cache in response to the determined destage pressure failing to exceed the threshold.

18. The system of claim 17, wherein the cache controller is further configured to receive at least a portion of the dirty write data from the nonvolatile solid-state storage device in the sequential backing store address order and to destage the received dirty write data to the backing store in the sequential backing store address order.

19. The system of claim 17, further comprising a host computer system comprising a processor, wherein the cache controller and comprises a device driver executing on the processor of the host computer system.

* * * * *